United States Patent [19]

Okayasu

[11] Patent Number: 5,659,554
[45] Date of Patent: Aug. 19, 1997

[54] TEST CASE GENERATING APPARATUS

[75] Inventor: Jiro Okayasu, Kawasaki, Japan

[73] Assignee: Kabushiki Kaisha Toshiba, Japan

[21] Appl. No.: 378,386

[22] Filed: Jan. 25, 1995

[30] Foreign Application Priority Data

Jan. 26, 1994 [JP] Japan .................................. 6-006901

[51] Int. Cl.$^6$ .................................................. G01R 31/28
[52] U.S. Cl. ......................... 371/27.1; 364/578; 364/580; 364/579
[58] Field of Search ....................... 371/27, 24; 364/579, 364/580, 550, 551.01, 578; 395/183.08, 183.09, 183.01, 50, 51, 52, 54, 88, 93

[56] References Cited

U.S. PATENT DOCUMENTS

| | | | |
|---|---|---|---|
| 4,692,921 | 9/1987 | Dahbura et al. | 371/27 |
| 5,161,115 | 11/1992 | Teshima et al. | 364/580 |
| 5,371,683 | 12/1994 | Fukazawa et al. | 364/489 |
| 5,450,598 | 9/1995 | Kaplan et al. | 364/419.12 |
| 5,488,573 | 1/1996 | Brown et al. | 371/27 |

FOREIGN PATENT DOCUMENTS 2-127849   5/1990   Japan .

OTHER PUBLICATIONS

"Testing Software Design Modeled by Finite–State Machines", T. Chow; *IEEE Transactions on Software Engineering*, vol. SE4, No. 3, May 1978.

*Primary Examiner*—Robert W. Beausoliel, Jr.
*Assistant Examiner*—Trinh L. Tu
*Attorney, Agent, or Firm*—Banner & Witcoff, Ltd.

[57] ABSTRACT

A test case generating apparatus for generating test cases used for verifying operations of an object, includes operation specification describing unit for describing operation specifications of the object using a plurality of parallel and/or hierarchical state transition diagrams, state transition diagram searching unit for searching the plurality of state transition diagrams described by the operation specification describing unit to select a transition from a predetermined state to a state on the state transition diagram, and outputting a selection result, and action/event relation managing unit for storing relations between actions and events, and controlling a transition selection operation of the state transition diagram searching unit by managing transitions which never occur in practice. The apparatus further includes parallel (hierarchy) relation managing unit for controlling the transition selection operation of the state transition diagram searching unit by managing the searching order of the plurality of parallel and/or hierarchical state transition diagrams described by the operation specification describing unit (and adequacy of transition coverage).

20 Claims, 10 Drawing Sheets

| STATE | EVENT | ACTION | NEXT STATE |
|---|---|---|---|
| COOLER ON | ROOM TEMPERATURE < COOLING TEMPERATURE | COOLER STOP | COOLER OFF |
| COOLER OFF | ROOM TEMPERATURE > COOLING TEMPERATURE | COOLER START | COOLER ON |
FIG. 4
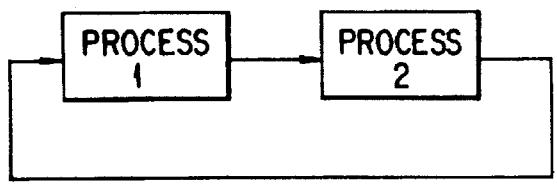
FIG. 5
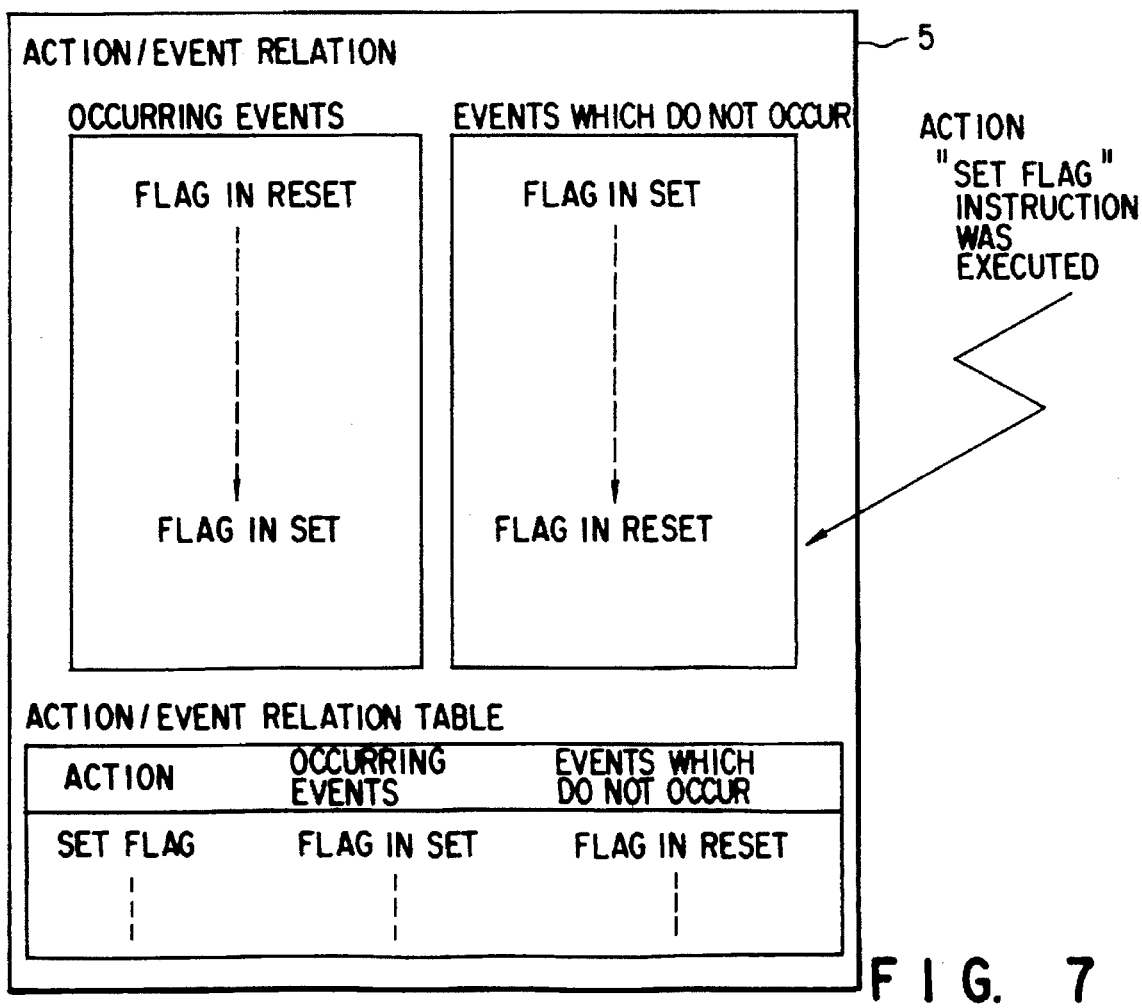
FIG. 7

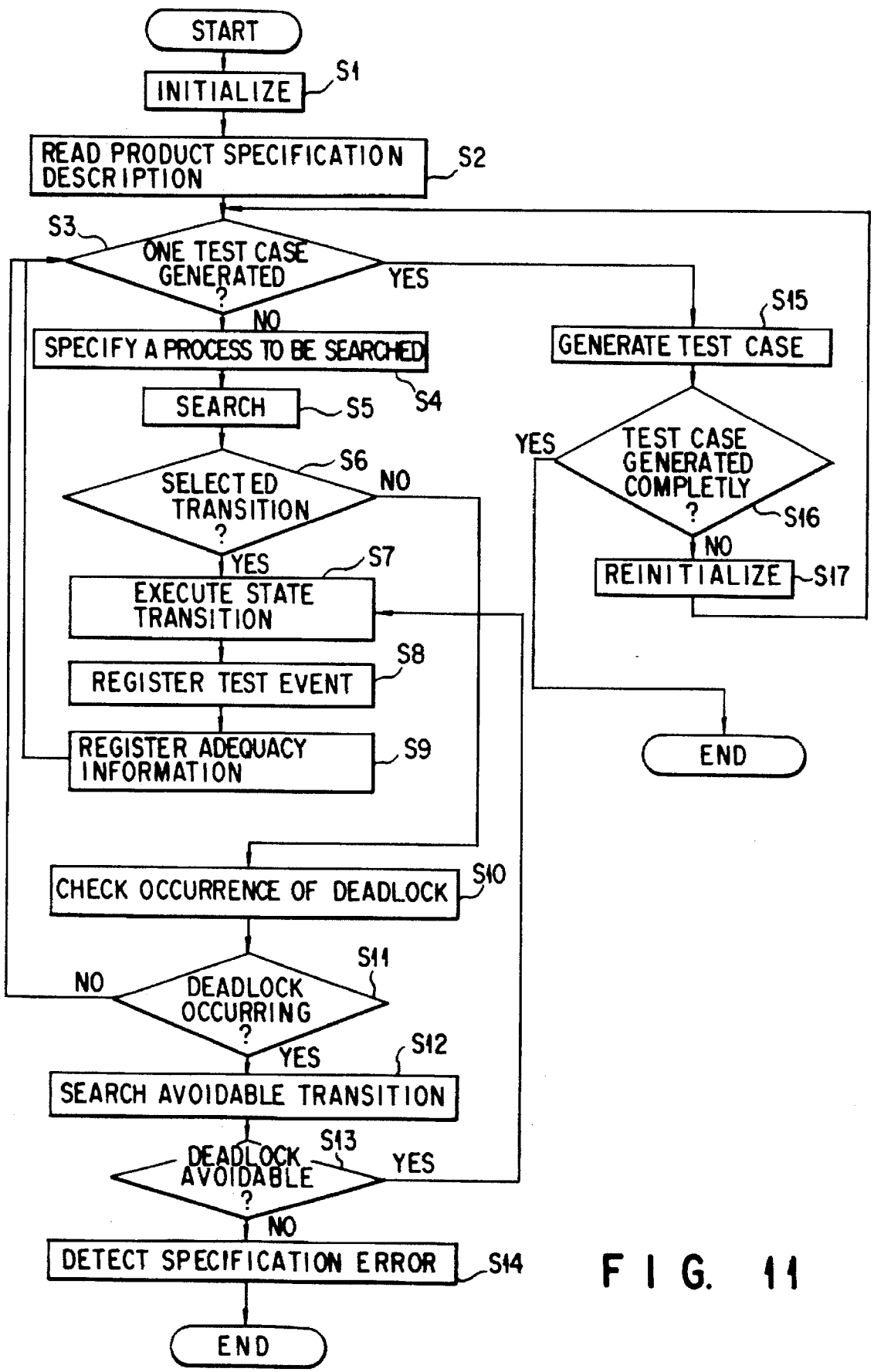
F I G. 11

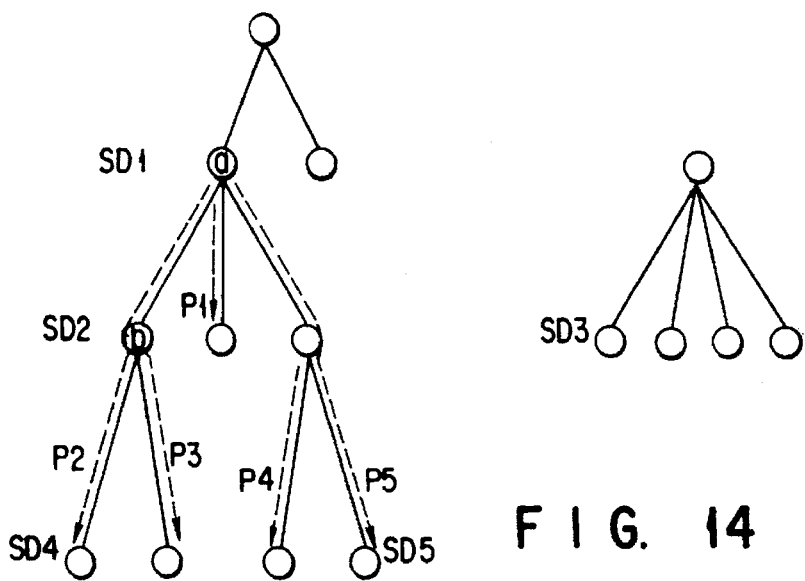
F I G. 14
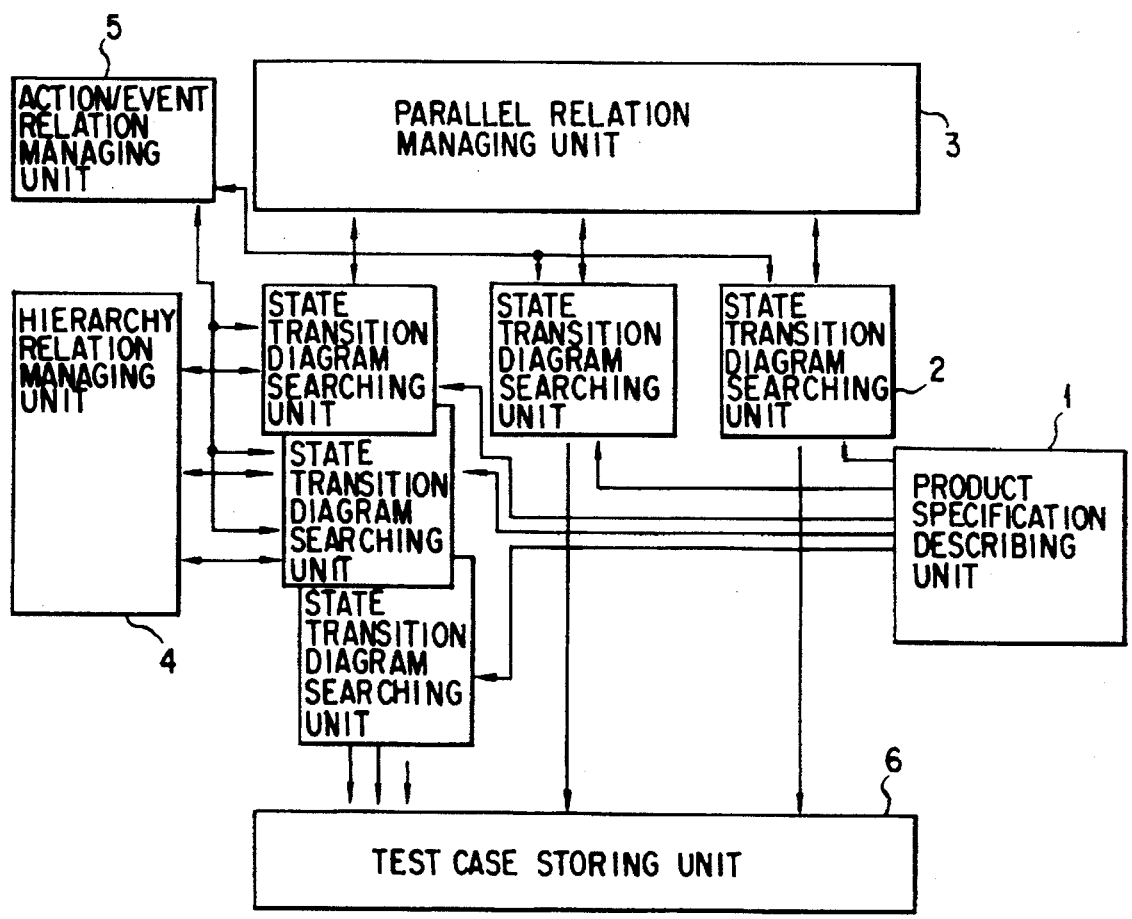
F I G. 15

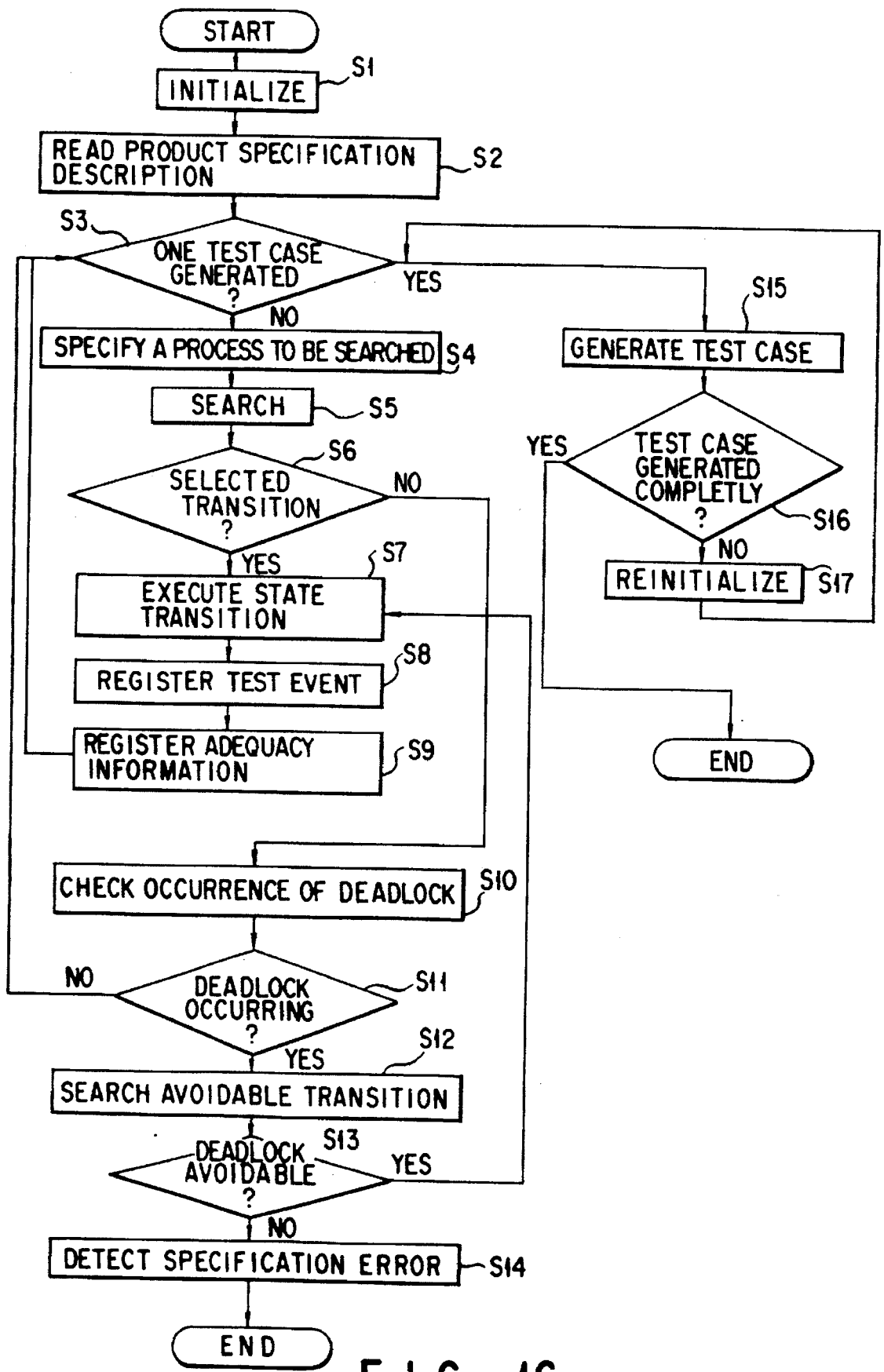
F I G. 16

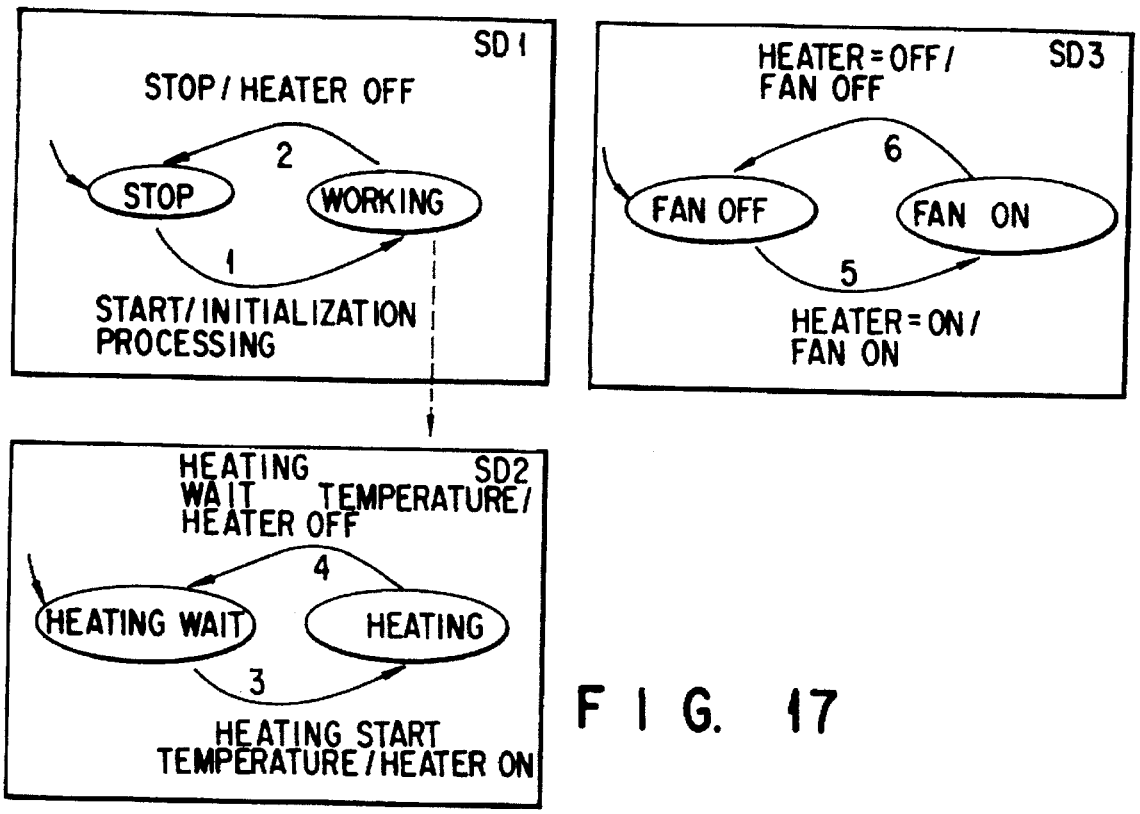
FIG. 17
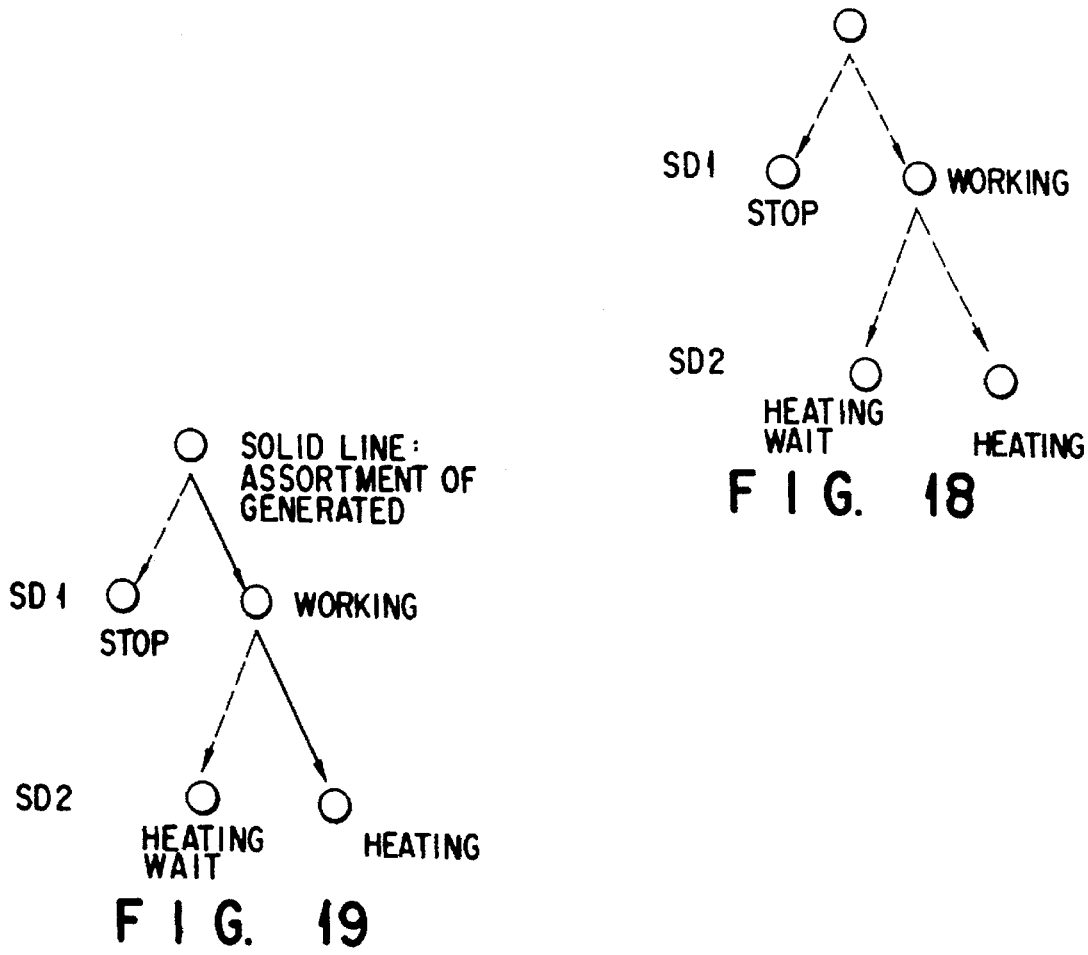
FIG. 18
FIG. 19

TEST CASE GENERATING APPARATUS

BACKGROUND OF THE INVENTION

1. Field of the Invention

The present invention relates to a test case generating apparatus for generating test cases used to an operation test in a development of products using computers.

2. Description of the Related Art

Most apparatuses used nowadays utilize computers. For example, most of consumer products, traffic means, and apparatuses in factories, power plants, and the like utilize computers. Products in which computers are utilized (applied) will be referred to as applied products using computers hereinafter for the sake of simplicity. As such applied products using computers are intricately related to our everyday life, failures of the applied products using computers influence the society very largely, and hence, requirements for the reliability of the applied products using computers are becoming increasingly severe.

In order to assure the reliability of the applied products using computers, test phases are important. Operations of all items such as functional specifications, performance specifications to be satisfied by a given product must be actually confirmed, and if a failure is found, the failure must be corrected to guarantee the normal operations of the product in every situation. Therefore, a question associated with the kind and the number of times of tests (a format which defines the method, the number of times (quantities), and the like of tests will be referred to as a "test case" hereinafter) is very important upon assurance of the reliability of products. In order to assure the reliability of products by conducting tests within limited ranges of time lengths and work amounts, it is indispensable to make efficient test cases.

In conventional testing, a check-list as a table of functions and performances to be satisfied by a given product is used as test cases, and testers confirms check items one by one by hand operations, thereby assuring the reliability of the product. In this case, the check-list is effective in terms of confirmation of product operations. However, it is not definite how efficiently the check-list actually covers possible operations of the product. In general, it is very difficult even for experts to realize, as a check-list, test cases which cover all possible operations of the product and can confirm them. Therefore, in conventional tests, a skilled engineer confirms possible operations within a limited period of time on the basis of his or her own product knowledge and experiences. However, with the recent trends of complicated, large-scale applied products using computers, it is becoming difficult even for experts to assure the reliability of products by the above-mentioned method depending on their experiences and sixth senses.

In tests by a hand method, sensor inputs and the like to a product must be generated using some devices (e.g., a variable resistor, and the like). However, with this method, it is not easy to practically guarantee if an input to a test object is an input for a required test. Furthermore, in tests by a hand method, it is very troublesome to set test conditions corresponding to test cases by generating input signals one by one. Therefore, in the conventional tests, a large number of steps are required in testing or the number of test cases that can be done within a limited period of time is limited. As a result, the productivity and/or quality of products may be adversely influenced.

As described above, in the conventional test method, it is very difficult to sufficiently guarantee the reliability of applied products using computers.

On the other hand, a method using means for generating test inputs that can cover modules constituting a program by analyzing the architecture of the program installed in an applied product using a computer as an object to be tested, has been proposed. However, this method can only be applied to, at most, a unit test for a program module in consideration of the complexity and scale of the program, and cannot be used in integration tests and system tests of the product.

In some product fields, attempts have been made to formally describe the specifications of products and to generate test cases on the basis of the specification description. For example, in the fields of electronic circuits, communication protocols, and the like, a method of describing specifications using a state transition diagram, and automatically generating test cases which can execute all possible operations described in the specifications has been proposed. U.S. Pat. No. 4,962,921 is an example of such a method. However, even with this method, with the complicated, large-scale product specifications, it is difficult to describe all the specifications of a given product using one state transition diagram. For this reason, it is impossible to automatically generate test cases even by this method.

As described above, it is very difficult to generate test cases which can cover all possible operations of a program, and can sufficiently assure the reliability of a given applied product using a computer.

In tests using a check-list, the adequacy of the tests is determined by test cases in the list. The test cases require much labor since it must be manually generated with reference to the specification of a product. Since test cases largely depend on the original specification, it is very difficult to generate a sufficiently reliable check-list (test cases) based on the existing specification using a natural language due to its ambiguity.

Upon generation of test cases based on the formal specification description, which is proposed to solve the above-mentioned problems, it is difficult to describe the specifications themselves and to generate test cases without omissions as the specifications themselves have a larger scale and are complicated.

SUMMARY OF THE INVENTION

It is an object of the present invention to provide test cases generating apparatus which can easily describe even large-scale, complicated specifications of a product, and can automatically generate test cases that can efficiently include product operations without omissions on the basis of the specifications, thereby sufficiently assuring the reliability of the product.

A test case generating apparatus according to the present invention is characterized by comprising operation specification describing means for describing operation specifications of the object using a plurality of parallel state and/or hierarchical state transition diagrams; state transition diagram searching means for searching the plurality of state transition diagrams described by the operation specification describing means to select a transition from a predetermined state to a state on the state transition diagram, and outputting a selection result; and action/event relation managing means for storing a relation between an action and an event, and controlling a transition selection operation of the state transition diagram searching means by managing a transition which never occurs in practice.

The apparatus further comprises hierarchy relation managing means for controlling the transition selection operation of the state transition diagram searching means by managing a searching order of the plurality of hierarchical state transition diagrams described by the operation specification describing means and adequacy of transition coverage and/or parallel relation managing means for controlling the transition selection operation of the state transition diagram searching means by managing a searching order of the plurality of parallel state transition diagrams described by the operation specifications describing means.

The apparatus still further comprises test case storing means for storing event information for causing the transition output from the state transition diagram searching means as test cases. The preferable manners as follows.

(1) The test case storing means comprises means for time-serially managing events selected by the state transition diagram searching means.

(2) The state transition diagram searching means comprises means for checking an occurring event with reference to the action/event relation managing means.

(3) The state transition diagram searching means comprise means for discriminating whether or not a selectable transition covers all state combinations among layers.

A test case generating method according to the present invention is characterized by comprising the steps of: describing an Operation specification of the object using a plurality of state transition diagrams in at least one of parallel and hierarchy formats; searching the plurality of state transition diagrams to select a transition from a predetermined state to a state on the state transition diagram, and outputting a selection result; and storing a relation between an action and an event, and controlling the transition selection operation by managing a transition which never occurs in practice. Furthermore, the searching step comprises the step of checking an occurring event with reference to the relation between the action and the event. The method further comprises the step of: controlling the transition selection operation by managing a searching order of the plurality of state transition diagrams. In addition, the controlling step comprises the step of discriminating whether or not a selectable transition covers all state combinations among layers.

According to the present invention, since the operation specification describing means adopts at least one of parallel and hierarchy concepts and describes the operation specifications of a product, large-scale, complicated operation specifications can be very easily described.

The operation specifications of an object, which are described by the operation specification describing means, are subjected to searching processing by the state transition diagram searching means in units of state transition diagrams. The state transition diagram searching means regards each state transition diagram as a directed graph which has states as nodes, and transitions as arcs directed in the directions of transitions, and searches the state transition diagram while following the nodes in the directions of arcs, thereby specifying operations as a series of paths of the directed graph in the state transition diagram.

The parallel relation managing means manages the searching execution order of parallel state transition diagrams. The hierarchy relation managing means manages the searching execution order of hierarchical state transition diagrams, and discriminates the adequacy of transition coverage in consideration of hierarchy, thereby managing if searching is to be performed. The action/event relation managing means avoids searching of transitions whose events cannot be generated in practice by holding the relations between actions and events.

With the above arrangement, reliability can be assured as operation verification of an object, and test cases which can cover product operations without omissions can be generated.

As described above, when the present invention is used, test cases without omissions can be easily generated for integration tests and system tests of a product.

When test cases generated according to the present invention are used, tests which cover a product program can be conducted, and the reliability of the product can be sufficiently assured.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 4 is a view for explaining a data storage method of a state transition diagram searching unit in FIG. 2;

FIG. 5 is a view for explaining a parallel execution managing method of a parallel relation managing unit in FIG. 2;

FIG. 7 is a view for explaining an action/event relation managing method of an action/event relation managing unit 5 in FIG. 2;

FIG. 11 is a flow chart for explaining the operation of the test case generating apparatus according to the second embodiment;

FIG. 14 is a view for explaining a adequacy-tree used for the test case generating apparatus in FIG. 10 to discriminate the adequacy of tests;

FIG. 15 is a schematic block diagram showing the arrangement of a test case generating apparatus according to the third embodiment of the present invention;

FIG. 16 is a flow chart for explaining the operation of the test case generating apparatus according to the third embodiment shown in FIG. 15;

FIG. 17 is a view showing the specifications of state transition diagrams used in a test case generation example;

FIG. 18 is a view showing a adequacy-tree at the beginning of the test in the test case generation example; and FIG. 19 is a view showing a adequacy-tree in the middle of the test case generation example.

DETAILED DESCRIPTION OF THE PREFERRED EMBODIMENT

Figure 1:
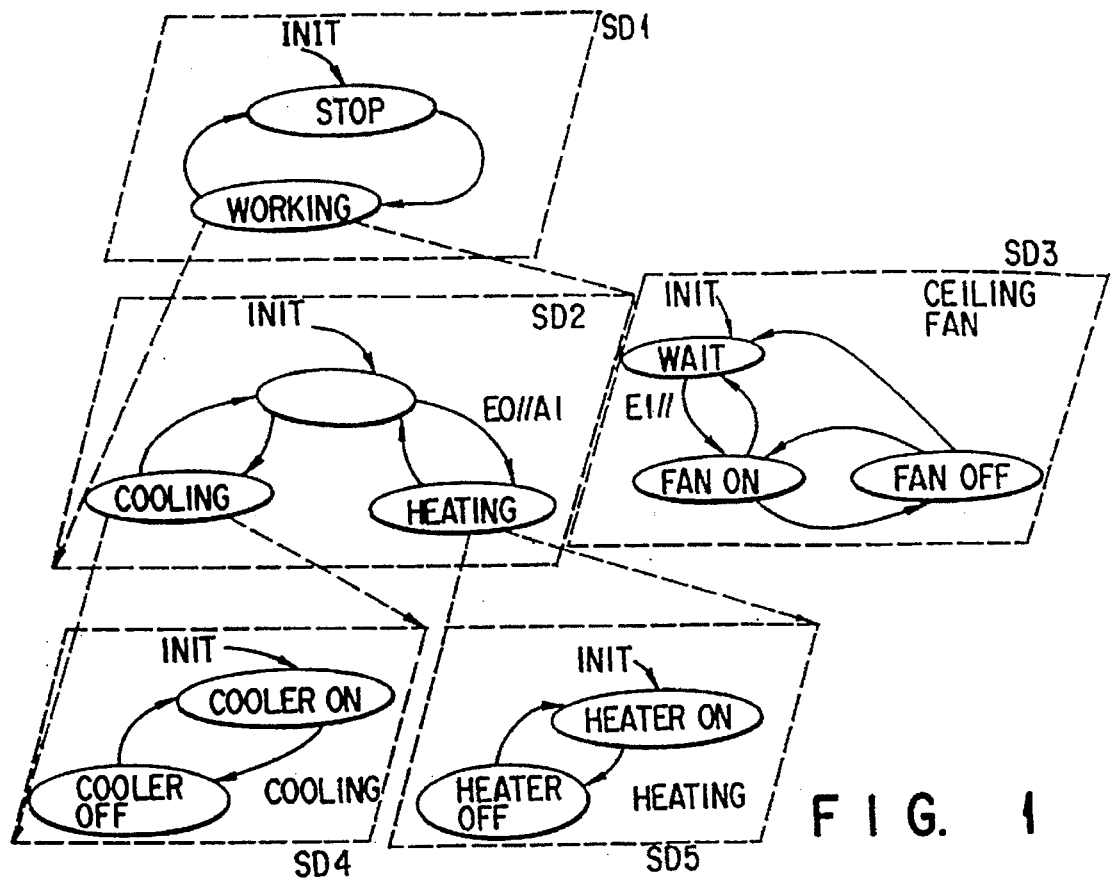
FIG. 1 is a view showing an example of parallel and hierarchical state transition diagrams as an object for which test cases are generated by a test case generating apparatus of the present invention.

The preferred embodiments of the present invention will be described hereinafter with reference to the accompanying drawings.

Prior to the description of the first embodiment of the present invention, state transition diagrams which are used to describe the product specifications of a product to be tested in the present invention, and hierarchy and parallel concepts will be described below.

The operation specifications of an applied product using a computer can be described using state transition diagrams since the operations of the applied product using a computer have a nature of executing given operations in response to external inputs and requests.

In each state transition diagram, the product operations are described by repeating a cycle of determining an output and a new internal state on the basis of an external input and the current internal state of the product like:

Input (condition) internal state→output (processing) next state. On an actual state transition diagram, a plurality of possible internal states of a product are expressed by circular marks (○), and a state transition from a given internal state to the next internal state is expressed by an arrow (→). Furthermore, an input as a condition of the state transition and an output of processing executed as a result of the state transition are described as "input/output" above the arrow. In the following description, an input condition will be referred to as an "event" and an output processing as an "action" hereinafter.

In order to cope with large-scale, complicated specifications, the present invention introduces at least one of parallel and hierarchy concepts in state transition diagrams. The "parallel" and "hierarchy" concepts will be briefly described below.

The "hierarchy" concept is to classify operation specifications into levels in correspondence with their degrees of abstraction. A plurality of state transition diagrams which have a hierarchical structure corresponding to the operation specification levels are written made. These hierarchical state transition diagrams have the following relation.

A state transition diagram obtained by detailing (embodying) a given state described in a given state transition diagram (a state transition diagram of a higher layer) corresponds to another state transition diagram (a state transition diagram of a lower layer). While the state transition diagram of the higher layer is in a given state, the state transition diagram of the lower layer corresponding to the state is simultaneously executed. When the state transition diagram of the higher layer transits from the state to another state, the execution of the corresponding state transition diagram of the lower layer ends. As described above, the present invention has a feature in which a plurality of state transition diagrams are simultaneously executed since it adopts the hierarchical state transition diagrams.

The "parallel" concept is to simultaneously execute a plurality of operations while maintaining a parallel relation therebetween. A plurality of parallel state transition diagrams (including hierarchical state transition diagrams) are simultaneously executed not in a hierarchy relation but in a parallel (independent) relation. Therefore, state transition diagrams to be parallelly executed basically have no relation therebetween unlike in hierarchical state transition diagrams. However, when certain synchronization or the like must be achieved between parallel state transition diagrams on the specifications, their relation must be described on the specifications using events and actions.

Note that the parallel and hierarchy concepts of the state transition diagrams can be simultaneously utilized.

FIG. 1 is a view showing an example of parallel and hierarchical state transition diagrams as an object for which test cases are to be generated by a test case generating apparatus of the present invention.

A plurality of state transition diagrams shown in FIG. 1 define the specifications of an automatic air-conditioning system. In FIG. 1, descriptions of events and actions are omitted. The specifications of the automatic air-conditioning system (to be simply referred to as a "system" hereinafter) shown in FIG. 1 will be briefly described below.

When the system is executed, it starts monitoring of the external temperature. When the external temperature exceeds a predetermined temperature, the system starts a cooling operation; when the external temperature becomes lower than another predetermined temperature, the system starts a heating operation. Only when the heating operation is started, a ceiling fan is rotated/stopped at a predetermined period to circulate warm air. During the heating operation (or cooling operation), the system monitors room temperature, and performs an operation of a heater (or cooler) to have a predetermined temperature as a threshold value. When the external temperature falls within a given range, the system stops the heating or cooling operation.

Referring to FIG. 1, a state transition diagram SD1 is the highest layer of the system. In FIG. 1, for example, state transition diagrams SD2 and SD3 have a parallel relation therebetween, and state transition diagrams SD2 and SD4, state transition diagrams SD2 and SD5, and the like have a hierarchy relation therebetween.

Upon reception of an air-conditioning start instruction, the system changes the system state during the operation, and develops a state transition diagram SD2 as a lower layer of the state transition diagram SD1.

The state transition diagram SD2 describes operation specifications for monitoring the external temperature and for controlling start/stop of heating and cooling. In the state transition diagram SD2, when heating (or cooling) is started, the state transits to heating (or cooling), and a state transition diagram SD4 (or SD5) of heating (or cooling) as a lower layer of heating (or cooling) is developed.

A state transition diagram SD3, which describes the operation of ceiling fan control is started as a state transition diagram parallel to the state transition diagram SD2 simultaneously with the beginning of heating. The state transition diagram SD2 is started by an action A1, and the ceiling fan transits its state from a wait state to a fan ON state in response to an event E1 induced by the action A1, thus starting the operation.

Furthermore, the operation of the ceiling fan ends in response to an event (not shown) generated by an action (not shown) upon transition for ending heating in the state transition diagram SD2, and the state transition diagram SD2 is set in a wait state.

A simple example has been described. As described above, by introducing the parallel and hierarchy concepts, easy-to-understand, compact specifications can be described.

In the state transition diagrams shown in FIG. 1, following neighboring states upon transition of states from an initial state corresponds to following a flow of product operations. Furthermore, a flow of product operations is specified by a sequence of actually followed transitions (transition sequence). Since test cases are the flow of operations of a product to be tested, it is expressed as a transition sequence of the state transition diagrams. Furthermore, since the transition sequence can also be expressed by a sequence of events along the transition sequence, the test case also corresponds to an event sequence.

In the present invention, the test case is automatically generated in the form of an event sequence.

Figure 2:
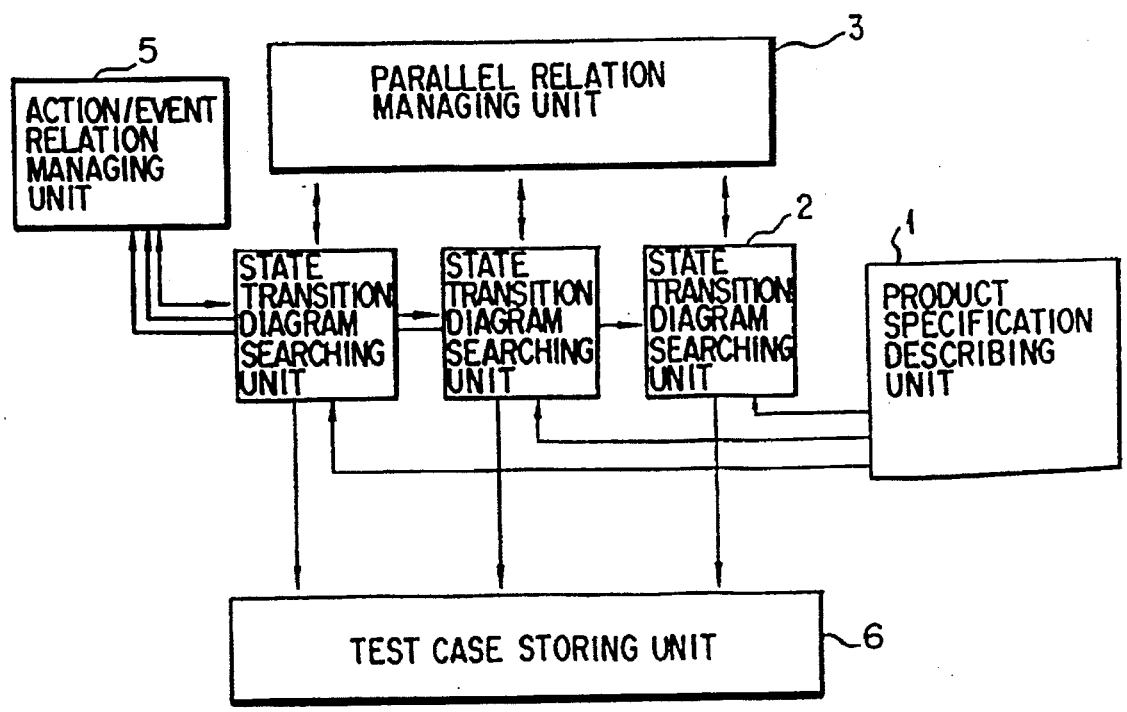
FIG. 2 is a schematic block diagram showing the arrangement of a test case generating apparatus according to the first embodiment of the present invention.

FIG. 2 is a block diagram showing the arrangement of a test case generating apparatus according to the first embodiment of the present invention.

The test case generating apparatus of the first embodiment comprises a product specification describing unit 1, a plurality of state transition diagram searching unit 2, a parallel relation managing unit 3, an action/event relation managing unit 5, and a test case storing unit 6.

The product specification describing unit 1 formally describes the operation specifications of a product for which test cases are to be generated. In this case, the product specification describing unit 1 describes the operation specifications (i.e., the product specifications) as state transition diagrams having the parallel concept. By introducing the parallel concept in the description of state transition diagrams, large-scale specifications can be easily described.

Each of the state transition diagram searching units 2 searches state transition diagrams as directed graphs for test case generation. More specifically, each state transition diagram searching unit 2 reads state transition information from the product specification describing unit 1, and generates test cases while specifying the operations of the product as a series of paths of directed graphs in the state transition diagrams. During execution, one state transition diagram searching unit 2 is assigned to one state transition diagram. Each state transition diagram searching unit 2 always manages the current state of the corresponding state transition diagram, and executes searching by a method of transition the current state to the next state by selecting transitions from the current state one by one with reference to an occurring/unoccurring event informed from the action/event relation management unit 5 (to be described in detail later). Each transition information selected by each state transition diagram searching unit 2 is sequentially transmitted to the test case storing unit 6 in the form of an event for causing the transition, and is stored as an event series.

The parallel relation managing unit 3 manages the relation of a plurality of state transition diagrams which are parallelly operated. More specifically, the parallel relation managing unit 3 manages the execution order of searching a plurality of parallel transition state diagrams. This is because the parallel state transition diagrams apparently have a parallel relation therebetween but are searched in a order in practice.

The action/event relation managing unit 5 manages the relations of actions and events. The relations of actions and events are normally used in communications between parallel state transition diagrams, and the action/event relation managing unit 5 manages a relation in which upon execution of a given action, a certain event is consequently occurred (or not occurred). The action/event relation managing unit 5 manages, for example, a relation such that when an action "set flag" is executed, an event "flag is in set state" is generated. In this manner, when the action/event relation managing unit 5 presents occurring/unoccurring event information to the searching units 2, a test case corresponding to an event, which never occurs in practice, can be avoided from being generated.

The test case storing unit 6 holds (stores) a test case which is being generated (or which has been generated) by the state transition diagram searching units 2. The storing unit 6 receives and stores transitions (event information for causing the transitions in practice) which are sequentially selected by and informed from the state transition diagram searching units 2. Upon completion of searching by the state transition diagram searching unit 2, series of these transitions (event information) is stored as a test case in the test case storing unit 6.

The operation of the test case generating apparatus according to the first embodiment with the above arrangement will be described below.

The product specification describing unit 1 formally describes the operation specifications of a product. The product specifications are described in the form of state transition diagrams. In this case, the present invention introduces the parallel concept in normal state transition diagrams to provide describability of describing recent complicated, large-scale specifications. Since the parallel concept is used in the description of the operation specifications to allow structured definition of the operation specifications, the operation specifications can be easily described.

The state transition diagram searching units 2 respectively store a plurality of parallel state transition diagrams. Each state transition diagram searching unit 2 searches the corresponding state transition diagram using, e.g., a directed graph searching technique. More specifically, each state transition diagram searching unit 2 searches while specifying operations as a series of paths of directed graphs in the state transition diagram. When a plurality of state transition diagrams are operated simultaneously because a plurality of state transition diagrams are in a parallel relation, the state transition diagram searching units 2 execute searching in accordance with a searching order instruction of the corresponding state transition diagrams from the parallel relation managing section 3, thereby generating test cases for the product as a whole.

Upon searching of the state transition diagrams by the state transition diagram searching units 2, if the state transition diagrams are merely searched as directed graphs, every transition are possible. However, each transition is associated with an event and an action. In addition, since an event means a condition of transition, and an action means processing upon transition, an event which does or does not occur in a given state can often be identified. Such a situation is often observed especially when a plurality of parallel state transition diagrams exchange information.

The action/event relation managing unit 5 manages the relations of actions and events, and identifies an event which can occur (or cannot occur) in a given state. When each state transition diagram searching unit 2 selects a transition during searching, it inquires the action/event relation managing unit 5 to check possibility of an event, and does not generate a test case corresponding to an impossible operation in practice.

Transitions (more precisely, events which cause the transitions) selected by the state transition diagram searching unit 2 are aligned in a sequence in the order of occurrence. Thus, test cases for the product specifications as a whole is constituted. Each state transition diagram searching unit 2 informs the selected transition (event) to the test case storing unit 6. The test case storing unit 6 time-serially manages informed transitions (events), and stores them as one test case upon completion of searching of all the state transition diagrams.

As described above, test cases without omissions, which can sufficiently assure the reliability of product operations in a system test can be generated.

Figure 3:
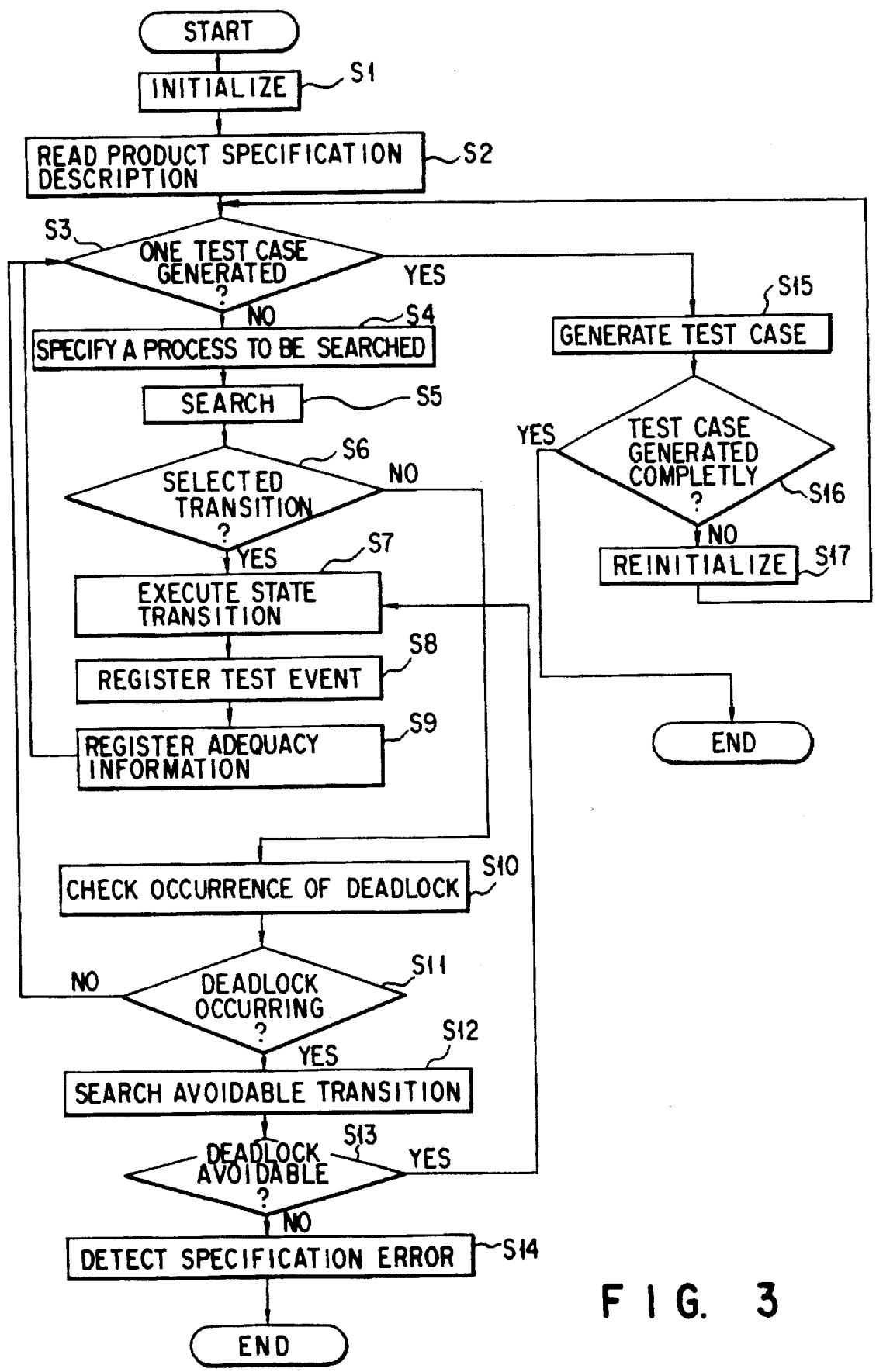
FIG. 3 is a flow chart for explaining the operation of the apparatus of the first embodiment shown in FIG. 2.

FIG. 3 is a flow chart showing a method of generating actual test cases by realizing the above-mentioned operations.

A control unit (not shown) initializes a work data area used for a generation work of a test case (step S1). This storage area serves as an area for storing adequacy of the test case in units of transitions, and an area for storing occurring/unoccurring events of the action/event relation managing unit. In this case, the adequacy of the test case means whether or not the test case covers all state transitions in the operation specifications described in the state transition diagrams. Therefore, when the adequacy of the test case is 100%, the test case covers all the state transitions in the operation specifications described in the state transition diagrams.

The state transition diagram searching units 2 read the product specifications described by the product specification describing unit 1 (step S2). In this case, since information of each state transition diagram is expressed as a set of four pieces of information, i.e., state, event, action, and next state in units of transitions, it is stored in an expression format shown in FIG. 4.

Searching (i.e., generation of test cases) is started from step S3. In step S3, it is checked if generation of one test case has ended. In this case, the end of generation of one test case is determined using the following conditions: when adequacies of all transitions become 100%; when adequacies of all transitions within a range accessible from the current state become 100%; when there is no transition destination from the current state of the state transition diagram; or when the test case exceeds a predetermined length; and the like.

The parallel relation managing unit 3 specifies searching processes of the state transition diagram searching unit 2 (step S4). Note that the process represents a unit of state transition diagrams which can be parallelly executed. One process is constituted by one or more state transition diagrams.

Upon specification of the searching processes, the parallel relation managing unit 3 performs scheduling using, e.g., a scheduling algorithm normally used in the field of operating systems in order to realize pseudo parallel operations. The simplest scheduling is that the processes are searched in turn, and the control returns to the first process if it has reached the last process. This scheduling can be realized by holding data with a structure shown in FIG. 5 in the parallel relation managing unit.

Figure 6:
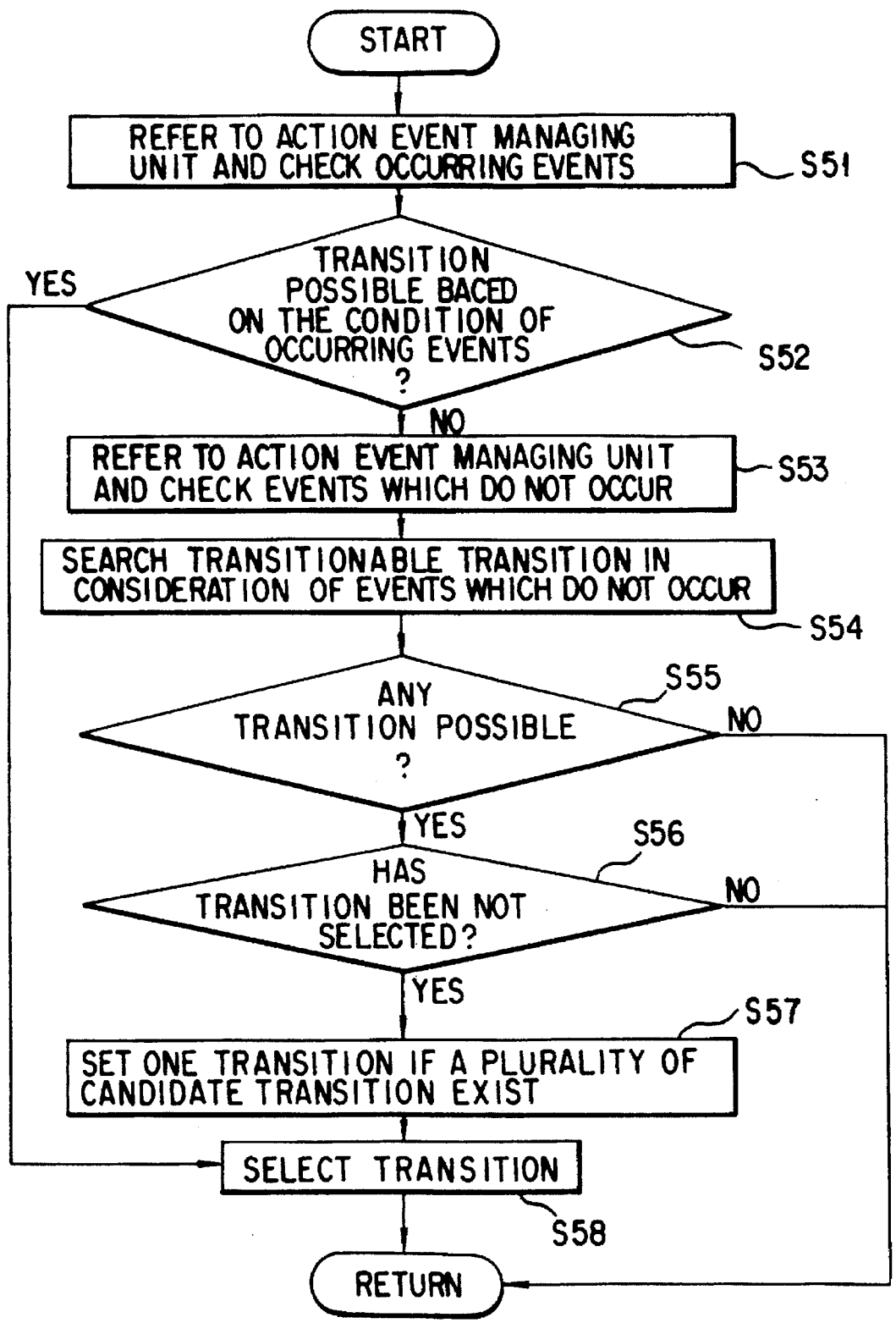
FIG. 6 is a flow chart for explaining searching execution processing in FIG. 3.

The state transition diagram searching units 2 execute searching of the state transition diagrams constituting the processes designated in step S4, and select transitions (step S5). FIG. 6 shows a method of searching transitions by the state transition diagram searching units 2.

It is checked if transitions from the current state include a transition caused by only one occurring event presented by the action/event relation managing unit 5 (step S51). If such a transition is found (step S52), the transition is selected (step S58), and the flow advances to step S6. Otherwise, the flow advances to step S53. A event which does not occur (hereinafter referred as an unoccurring event) presented by the action/event relation managing unit 5 is checked (step S53). Then, a transition which is transitionable even under the condition of the unoccurring event, i.e., a transition which does not become untransitionable due to the unoccurring event, is searched for (step S54). If a transitionable transition is not found (step S55), the flow advances to step S6. However, if transitionable transitions are found in step S55, it is checked if these transitions have been selected so far (step S56). If all the transitions have been selected, the flow advances to step S6. If these transitions include ones which have not been selected yet, one of the transitions is selected (step S57). As the method of selecting the transition, a method of determining a transition by a random number at an equal probability is available. The transition determined in step S57 is selected in step S58, and the flow then advances to step S6.

It is checked if a transition is selected as a result of execution of searching in step S5 (step S6). If a transition is selected, the flow advances to step S7, and the transition selected in step S5 is executed (step S7). If a transition is not selected in step S5, the flow advances to step S10. In step S7, execution of the transition is defined by execution of an action and a transition of a state.

Upon execution of an action, each state transition diagram searching unit 2 informs an action upon transition to the action/event relation managing unit 5, and the action/event relation managing unit 5 searches registered data for an occurring (unoccurring) event using the informed action as a key. The searched event is registered as an occurring/unoccurring event in the action/event relation managing unit 5, and is used for the subsequent searching processing.

FIG. 7 shows a detailed action/event managing method.

The action/event relation managing unit 5 has an occurring event list and an unoccurring event list, which are referred to by the state transition diagram searching unit 2, and an action/event relation table which stores a relation between events and actions. For example, in FIG. 7, when a flag is reset, "flag in reset" is stored in the occurring event list, and "flag in set" is stored in the unoccurring event list. As a result of selected transition by the state transition diagram searching unit 2, if an action "set flag" is executed, this information is transmitted to the action/event relation managing unit 5. The action/event relation managing unit 5 refers to the action/event relation table, and detects that an event "flag in set" occurs and "flag in reset" does not occur as a result of the action "set flag". Then, the managing unit 5 updates the generated and unoccurring event lists, as shown in FIG. 7.

A state transition is an operation for transiting the current state to a new state in accordance with the selected transition. The state transition diagram searching unit transits the current state to the next state as the selected transition destination. Thus, the next searching processing starts from the new current state (i.e., the next state).

In the test case storing unit 6, events constituting test cases are registered (step S8). In this case, the state transition diagram searching unit 2 transits event information for causing the transition selected in step S5 to the test case storing unit 6. The test case storing unit 6 stores the transmitted event information as a history of searching, and upon completion of searching, the stored history of searching constitutes one test case.

The test case storing unit 6 stores local adequacy information of the test case (step S9). As a method of managing adequacy, a method of storing the number of times of selection of each transition is available. Thus, transitions which have not been selected yet can be identified. When a transition is selected a plurality of number of times, one transition is avoided from being selected exclusively. Also, adjustment for concentrating to an important transition can be made.

Figure 8:
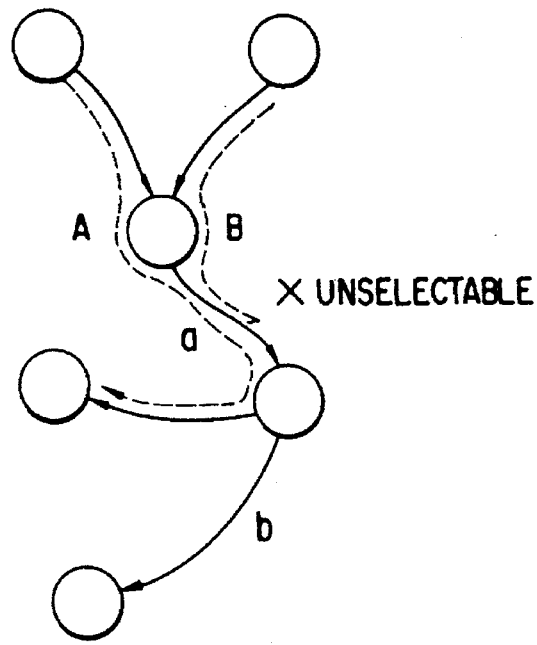
FIG. 8 is a view for explaining a searching execution method of the state transition diagram searching unit in FIG. 2.

If it is determined in step S6 that a transition is not selected, step S10 is executed. In step S10, occurrence of deadlock of searching is checked. When a plurality of test cases are generated, adequacy is locally satisfied during searching and no more selection of transitions is required there. For this reason, even when the state transition diagram includes a transition to be selected thereafter, the searching processing cannot often reach there. For example, in FIG. 8, after a test case corresponding to a path "A" occurs, a transition "a" has already satisfied adequacy. However, if searching is stopped there, a transition "b" cannot be tested. Such a situation is called "deadlock" of searching. The searching order of parallel state transition diagrams is managed by the parallel relation managing unit 3. If none of the state transition diagram searching units 2 select a transition even after a cycle of this searching is executed for the state transition diagrams, it is recognized that deadlock has occurred.

Processing branches depending on the occurrence/non-occurrence of deadlock in step S10 (step S11). If it is determined in step S11 that deadlock has not occurred, the flow advances to step S3; otherwise, the flow advances to step S12.

A transition which can avoid deadlock is searched for (step S12). In this case, one transition is selected from those from the current states of all the state transition diagram searching units 2. At this time, an unoccurring event is checked with reference to the action/event relation managing unit 5, and an untransitionable transition under the condition cannot be selected. If there are a plurality of selectable candidate transitions, one of these transitions is selected. As a selection method, a method of preferentially selecting a transition of the state transition diagram searching unit 2 including many unselected transitions, a method of selecting a transition with the smallest number of times of selection, a method of determining a transition by a random number at an equal probability if the conditions are the same, and the like are available.

As a result of step S12, if it is determined that a transition which can avoid deadlock can be found (step S13), the transition is selected, and the flow advances to step S7 to continue test case generation. If it is determined that a transition which can avoid deadlock cannot be found in step S12 (step S13), the product specifications themselves may be wrong specifications which cause deadlock. Thus, the flow advances to step S14, and a message indicating that an error is found in the product specifications themselves is presented to a developer. Thereafter, test case generation ends (step S14).

Figure 9:
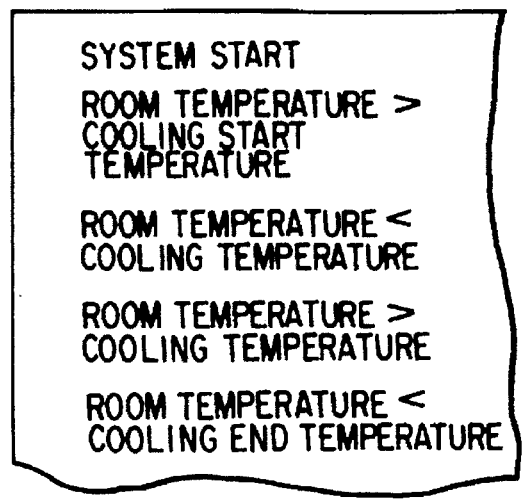
FIG. 9 is a view showing an output example of the apparatus shown in FIG. 2.

As a result of step S3, if generation of one test case ends, the flow advances to step S15, and a test case is generated (step S15). Note that a series of event histories stored in the test case storing unit 6 becomes a test case to be given to a product. The test case can be output as a file in a format, as shown in, e.g., FIG. 9. In addition, data may be supplied to a system for generating test signals, and automatic testing may be realized.

It is checked if generation of the test case is completed (step S16). The completion is determined under the following conditions: when adequacies of all transitions become 100%; when the number of test cases exceeds a predetermined value; and the like. If it is determined that generation of the test case is completed, the processing ends, otherwise, the flow advances to step S17 to reinitialize the work data area to prepare for the next test case generation (step S17). More specifically, operations for restoring the current state of each state transition diagram searching unit 2 to an initial state, restoring the storage state of occurring/unoccurring events of the action/event relation managing unit 5 to an initial state, and so on, are performed. Information associated with adequacy of each transition is preserved in this case. After reinitialization, the flow returns to step S3.

Figure 10:
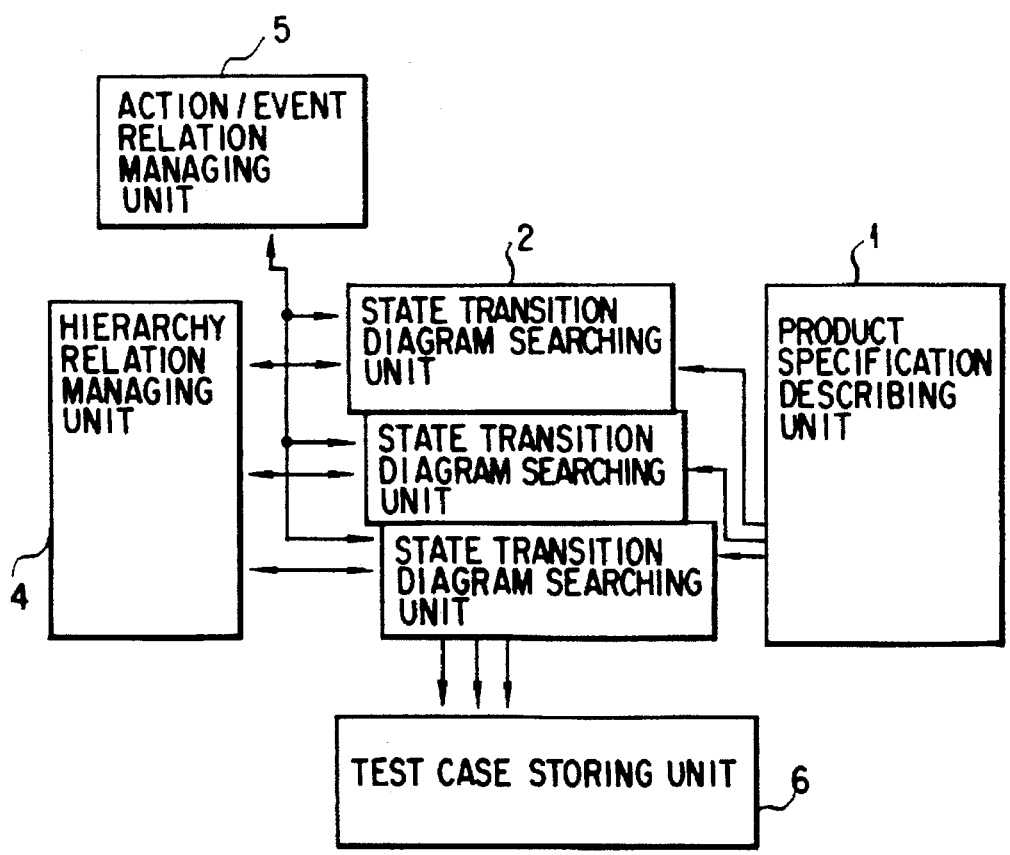
FIG. 10 is a schematic block diagram showing the arrangement of a test case generating apparatus according to the second embodiment of the present invention.

FIG. 10 is a block diagram showing the arrangement of a test case generating apparatus according to the second embodiment of the present invention. The same reference numerals in FIG. 10 denote the same parts as in FIG. 2.

The test case generating apparatus of the second embodiment comprises a product specification describing unit 1, a plurality of state transition diagram searching units 2, a hierarchy relation managing unit 4, an action/event relation managing unit 5, and a test case storing unit 6.

The product specification describing unit 1 formally describes the operation specifications of a product for which a test case is to be generated. In this case, the product specification describing unit 1 describes the operation specifications (i.e., the product specifications) as state transition diagrams having the hierarchy concept. By introducing the hierarchy concept in the description of state transition diagrams, large-scale specifications can be easily described.

Each of the state transition diagram searching units 2 searches state transition diagrams as directed graphs for test case generation. More specifically, each state transition diagram searching unit 2 reads state transition information from the product specification describing unit 1, and generates a test case while specifying the operations of the product as a series of paths of directed graphs in the state transition diagrams. During execution, one transition state diagram searching unit 2 is assigned to one state transition diagram. Each state transition diagram searching unit 2 always manages the current state of the corresponding state transition diagram, and executes searching by a method of transiting the current state to the next state by selecting transitions from the current state one by one with reference to an occurring/unoccurring event informed from the action/event relation management unit 5 (to be described in detail later). Each transition information selected by each state transition diagram searching unit 2 is sequentially transmitted to the test case storing unit 6 in the form of an event for causing the transition, and is stored as an event series.

The hierarchy relation managing unit 4 manages a plurality of state transition diagrams which are executed parallel to each other while holding a hierarchy relation thereamong as a result of hierarchy of the operation specifications. The first role of the hierarchy relation managing unit 4 is to manage the execution order of a plurality of hierarchical state transition diagrams. The second role of the hierarchy relation managing unit 4 is to monitor adequacy of transition coverage for transition selection of the state transition diagram searching units 2.

Since the state transition diagrams have a hierarchical structure, test cases which can assure the reliability of a product cannot be generated under a simple assumption that one transition need only be passed at least once.

For example in FIG. 1, assume that "operation stop" event is generated in the state transition diagram SD1 and a transition to a "stop" state is generated when the current states are respectively "working" (state transition diagram SD1), "cooling" (state transition diagram SD2), and "cooler ON" (state transition diagram SD4). If this situation is tested and the operation is normal, the transition to the "stop" state is confirmed in the conventional method. However, the reliability of a product cannot be sufficiently assured by only this test. Even in the transition to the "stop" state, if a stop request is issued when the current states are respectively "working" (state transition diagram SD1), "heating" (state transition diagram SD2), and "heater ON" (state transition diagram SD5), the product behaves in a different way, as a matter of course, and the test cannot be omitted. In this case, a situation in which the heater is kept ON even if the operation is stopped may go unnoticed.

As described above, even in a simple case, it is difficult to automatically generate test cases without omissions unless the hierarchy is considered.

The action/event relation managing unit 5 manages the relations of actions and events. The relations of actions and events are normally used in communications between parallel state transition diagrams, and the action/event relation managing unit 5 manages a relation in which upon execution of a given action, a certain event is consequently generated (or ungenerated). The action/event relation managing unit 5 manages, for example, a relation such that when an action "set flag" is executed, an event "flag is in set state" occurs. In this manner, when the action/event relation managing unit 5 presents occurring/unoccurring event information to the searching units 2, a test case corresponding to an event, which never occurs in practice, can be avoided from being generated.

The test case storing unit 6 holds (stores) a test case which is being generated (or which has been generated) by the state transition diagram searching units 2. The storing unit 6 receives and stores transitions (event information for causing the transitions in practice) which are sequentially selected by and informed from the state transition diagram searching units 2. Upon completion of searching by the state transition diagram searching unit 2, a series of these transitions (event information) is stored as a test case in the test case storing unit 6.

The operation of the test case generating apparatus according to the second embodiment with the above arrangement will be described below.

The product specification describing unit 1 formally describes the operation specifications of a product. The product specifications are described in the form of state transition diagrams. In this case, the present invention introduces the hierarchy concept in normal state transition diagrams to provide describability of describing recent complicated, large-scale specifications. Since the hierarchy concept is used in the description of the operation specifications to allow structured definition of the operation specifications, the operation specifications can be easily described.

The state transition diagram searching units 2 respectively store a plurality of state transition diagrams. Each state transition diagram searching unit 2 searches the corresponding state transition diagram using, e.g., a directed graph searching technique. More specifically, each state transition diagram searching unit 2 searches for a test case while specifying operations as a series of paths of directed graphs in the state transition diagram. When a plurality of state transition diagrams are operated simultaneously because a plurality of state transition diagrams are in a hierarchy relation, the state transition diagram searching units 2 execute searching in accordance with a searching order instruction of the corresponding state transition diagrams from the hierarchy relation managing unit 4, thereby generating a test case for the product as a whole.

Upon searching of the state transition diagrams by the state transition diagram searching units 2, whether or not a given transition is to be selected cannot be sufficiently determined by a normal concept of coverage, i.e., a concept in that each transition need only be passed at least once, but may be determined in consideration of a combination of a plurality of states of state diagrams in a hierarchy relation. The hierarchy relation managing unit 4 supplies adequacy information indicating whether or not each transition is to be selected to each state transition diagram searching unit 2 in response to an inquiry from the searching unit 2 in consideration of a combination of states (of state transition diagrams) in a hierarchy relation. With this processing, the state transition diagrams can be searched without omissions of product operations.

Upon searching of the state transition diagrams by the state transition diagram searching units 2, if the state transition diagrams are merely searched as directed graphs, every transition are possible. However, each transition is associated with an event and an action. In addition, since an event means a condition of transition, and an action means processing upon transition, an event which does or does not occur in a given state can often be identified.

The action/event relation managing unit 5 manages the relations of actions and events, and identifies an event which can occur (or cannot occur) in a given state. When each state transition diagram searching unit 2 selects a transition during searching, it inquires the action/event relation managing unit 5 to check possibility of an event, and does not generate a test case corresponding to an impossible operation in practice.

Transitions (more precisely, events which cause the transitions) selected by the state transition diagram searching unit 2 are aligned in a sequence in the order of occurrence. Thus, test cases for the product specifications as a whole is constituted. Each state transition diagram searching unit 2 informs the selected transition (event) to the test case storing unit 6. The test case storing unit 6 time-serially manages informed transitions (events), and stores them as one test case upon completion of searching of all the state transition diagrams.

As described above, test cases without omissions, which can sufficiently assure the reliability of product operations in a system test can be generated.

FIG. 11 is a flow chart showing a method of generating actual test cases by realizing the above-mentioned operations.

A control unit (not shown) initializes a work data area used for a generation work of a test case (step S1). This storage area serves as an area for storing adequacy of the test case in units of transitions, and an area for storing occurring/ unoccurring events of the action/event relation managing unit. In this case, the adequacy of the test case means whether or not the test case covers all state transitions in the operation specifications described in the state transition diagrams. Therefore, when the adequacy of the test case is 100%, the test case covers all the state transitions in the operation specifications described in the state transition diagrams.

The state transition diagram searching units 2 read the product specifications described by the product specification describing unit 1 (step S2). The information of the state transition diagram is stored in a table form shown in FIG. 4 in the first embodiment.

Searching (i.e., generation of test cases) is started from step S3. In step S3, it is checked if generation of one test case has ended. In this case, the end of generation of one test case is determined using the following conditions in consideration of an assembly of states among hierarchies: when adequacies of all transitions become 100%; when adequacies of all transitions within a range accessible from the current state become 100%; when there is no transition destination from the current state of the state transition diagram; or when the test case exceeds a predetermined length; and the like.

Figure 12:
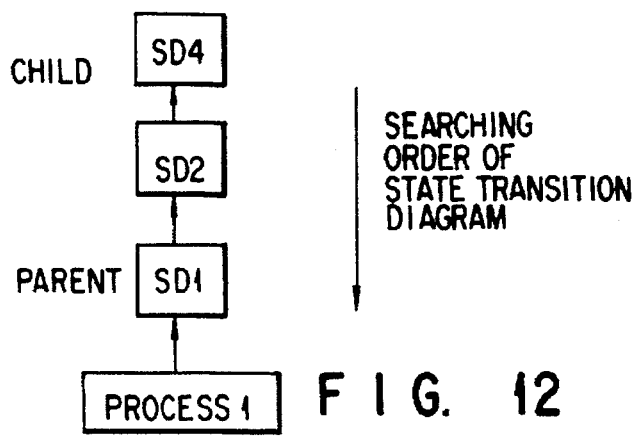
FIG. 12 is a view for explaining a hierarchical execution managing method of a hierarchy relation managing unit in FIG. 10.

The hierarchy relation managing unit 4 specifies a layer to be searched (step S4). If there is only one layer, the state transition diagram in the layer need only be searched. When a plurality of state transition diagrams having a hierarchy relation thereamong exist, the layers are simultaneously executed in principle, but the state transition diagrams in each layer must be searched in a sequential order in practice. Normally, the state transition diagrams are searched in an order from lower to higher layers. Such hierarchical execution can be realized by holding stack structure data having link relation as shown in FIG. 12 in the hierarchy relation managing unit 4.

Figure 13:
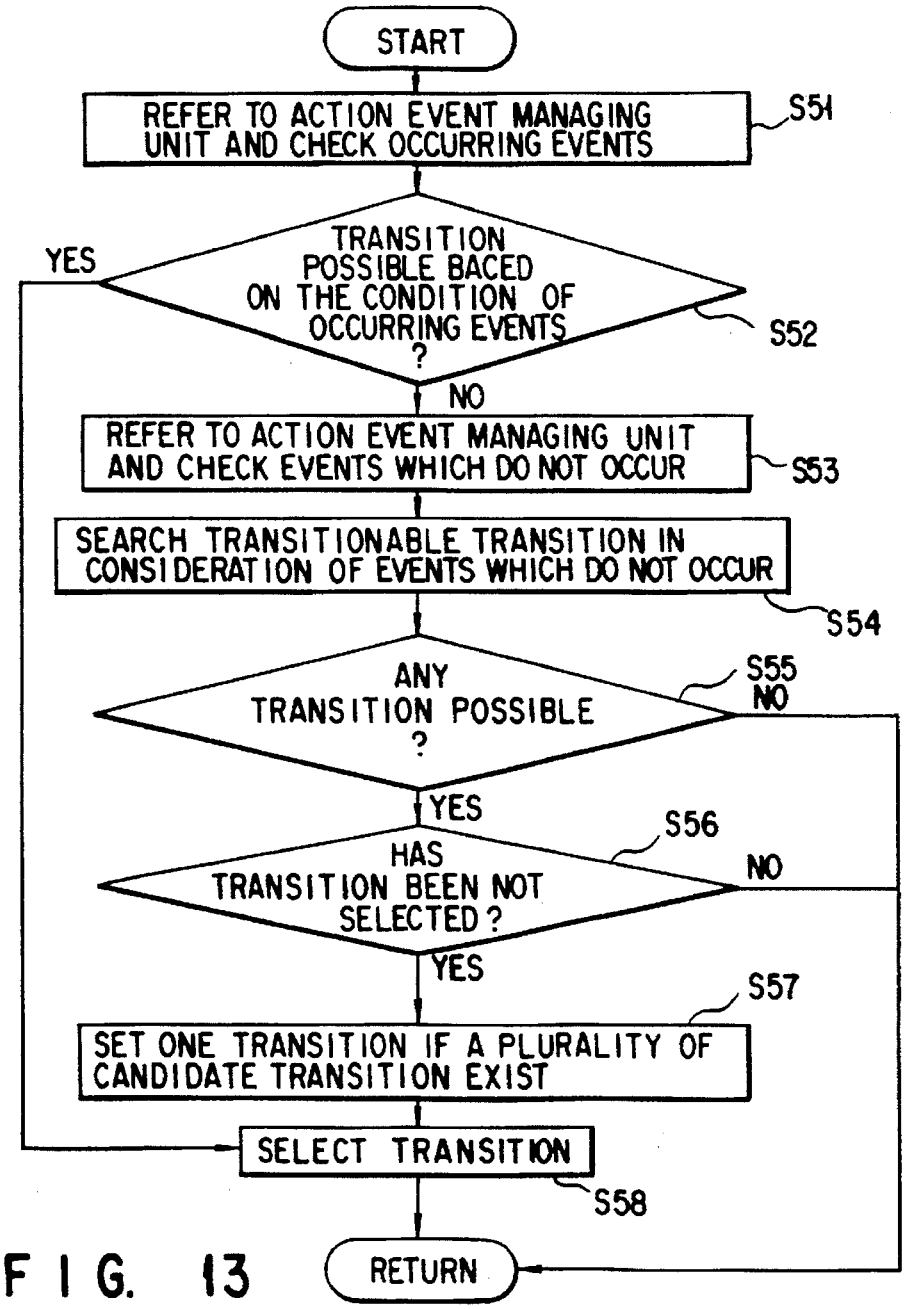
FIG. 13 is a flow chart for explaining searching execution processing in FIG. 11.

The state transition diagram searching units 2 execute searching of the designated state transition diagram, and select a transition (step S5). The selection of the transition is executed in accordance with the flow chart shown in FIG. 13.

It is checked if transitions from the current state include a transition caused by only one occurring event presented by the action/event relation managing unit 5 (step S51). If such a transition is found (step S52), the transition is selected (step S58), and the flow advances to step S6. Otherwise, the flow advances to step S53. A event which does not occur (hereinafter referred as an unoccurring event) presented by the action/event relation managing unit 5 is checked (step S53). Then, a transition which is transitionable even under the condition of the unoccurring event, i.e., a transition which does not become untransitionable due to the unoccurring event, is searched for (step S54). If a transitionable transition is not found (step S55), the flow advances to step S6. However, if transitionable transitions are found in step S55, it is checked if these transitions have been selected so far in consideration of an assembly of states among hierarchies (step S56). If all the transitions have been selected, the flow advances to step S6. If these transitions include ones which have not been selected yet, one of the transitions is selected (step S57). As the method of selecting the transition, a method of determining a transition by a random number at an equal probability is available. The transition determined in step S57 is selected in step S58, and the flow then advances to step S6.

It is checked if a transition is selected as a result of execution of searching in step S5 (step S6). If a transition is selected, the flow advances to step S7, and the transition selected in step S5 is executed (step S7). If a transition is not selected in step S5, the flow advances to step S10. In step S7, execution of the transition is defined by execution of an action and a transition of a state.

Upon execution of an action, occurring events and unoccurring events are registered in the action/event relation managing unit 5 as in execution of an action in the first embodiment.

A state transition is an operation for transiting the current state to a new state in accordance with the selected transition. The state transition diagram searching unit transits the current state to a new state, and passes the control to the hierarchy relation managing unit 4. The hierarchy relation managing unit 4 discriminates a change in hierarchy relation by the transition. As a result of the state transition, when execution of a state transition diagram of a lower layer ends, the hierarchy relation managing unit 4 issues a searching end request to the state transition diagram searching unit 2 corresponding to the state transition diagram to remove the corresponding state transition diagram searching unit 2 from the management range of the hierarchy relation managing unit 4. When a new layer is developed downward, the hierarchy relation managing unit 4 issues a searching start request to the state transition diagram searching unit 2 corresponding to the state transition diagram to place the corresponding state transition diagram in the management range of the hierarchy relation managing unit 4.

In the test case storing unit 6, events constituting test cases are registered (step S8). In this case, the state transition diagram searching unit 2 transits event information for causing the transition selected in step S5 to the test case storing unit 6. The test case storing unit 6 stores the transmitted event information as a history of searching, and upon completion of searching, the stored history of searching constitutes one test case.

In the test case storing unit 6, local adequacy information of a test case is registered (step S9). As a method of managing adequacy, a data architecture for recording the degree of coverage of tests is utilized. This data architecture is called a "adequacy-tree". The "adequacy-tree" will be briefly described below.

The "adequacy-tree" is a tree-structure diagram having the hierarchy relation shown in FIG. 14. FIG. 14 shows the adequacy-tree corresponding to the specifications shown in FIG. 1. In the "adequacy-tree", the hierarchy relation in a state appearing by setting an imaginary state at the uppermost position, and developing layers therebelow is expressed in the form of a tree.

The degree of coverage (i.e., adequacy) for a given transition is measured by pointing a state, from which the transition starts, on the "adequacy-tree", and checking how many ones of all paths extending to leaves (end nodes) of partial trees therebelow are covered. The paths extending to the leaves correspond to combinations of states in consideration of the hierarchy relation, and express the combinations of states of a product upon searching of one transition. Therefore, all paths to a leaf of a given partial tree correspond to all combinations of states of a product to be tested for a given transition. For a covered transition, a "covered" attribute is assigned to each path of the "adequacy-tree", thereby preventing omissions and repetitions in test cases. For example, in a transition from a state a in FIG. 14, a sufficient test case cannot be obtained unless operations associated with all five combinations of paths P1 to P5 can be confirmed. Similarly, in a transition from a state b, combinations of paths P2 and P3 are necessary.

If it is determined in step S6 that a transition is not selected, step S10 is executed. In step S10, the occurrence/non-occurrence of deadlock of searching is checked. The contents of the deadlock are the same as in the first embodiment. The searching order of the state transition diagrams in the hierarchy relation is managed by the hierarchy relation managing unit 4. If none of the state transition diagram searching units 2 select a transition even after a cycle of this searching is executed for the state transition diagrams, it is recognized that deadlock has occurred.

Processing branches depending on the occurrence/non-occurrence of deadlock in step S10 (step S11). If it is determined in step S11 that deadlock has not occurred, the flow advances to step S3; otherwise, the flow advances to step S12.

A transition which can avoid deadlock is searched for (step S12). In this case, one transition is selected from those from the current states of all the state transition diagram searching units 2. At this time, an unoccurring event is checked with reference to the action/event relation managing unit 5, and an untransitionable transition under the condition cannot be selected. If there are a plurality of selectable candidate transitions, one of these transitions is selected. As a selection method, in consideration of the hierarchy relation with reference of adequacy-tree, a method of preferentially selecting a transition of the state transition diagram searching unit 2 including many unselected transitions, a method of selecting a transition with the smallest number of times of selection, a method of determining a transition by a random number at an equal probability if the conditions are the same, and the like are available.

As a result of step S12, if it is determined that a transition which can avoid deadlock can be found (step S13), the transition is selected, and the flow advances to step S7 to continue test case generation. If it is determined that a transition which can avoid deadlock cannot be found in step S12 (step S13), the product specifications themselves may be wrong specifications which cause deadlock. Thus, the flow advances to step S14, and a message indicating that an error is found in the product specifications themselves is presented to a developer. Thereafter, test case generation ends (step S14).

As a result of step S3, if generation of one test case ends, the flow advances to step S15, and a test case is generated (step S15). Note that a series of event histories stored in the test case storing unit 6 becomes a test case to be given to a product. The test case can be output as a file in a format, as shown in, e.g., FIG. 9. In addition, data may be supplied to a system for generating test signals, and automatic testing may be realized.

It is checked if generation of the test case is completed (step S16). The completion is determined under the following conditions: when adequacies of all transitions become 100%; when the number of test cases exceeds a predetermined value; and the like. If it is determined that generation of the test case is completed, the processing ends, otherwise, the flow advances to step S17 to reinitialize the work data area to prepare for the next test case generation (step S17). More specifically, operations for restoring the current state of each state transition diagram searching unit 2 to an initial state, restoring the storage state of occurring/unoccurring events of the action/event relation managing unit 5 to an initial state, and so on, are performed. Information associated with adequacy of each transition is preserved in this case. After reinitialization, the flow returns to step S3.

FIG. 15 is a block diagram showing the arrangement of a test case generating apparatus according to the third embodiment of the present invention.

The test case generating apparatus of the third embodiment comprises a product specification describing unit 1, a plurality of state transition diagram searching unit 2, a parallel relation managing unit 3, a hierarchy relation searching unit 4, an action/event relation managing unit 5, and a test case storing unit 6.

The product specification describing unit 1 formally describes the operation specifications of a product for which a test case is to be generated. In this case, the product specification describing unit 1 describes the operation specifications (i.e., the product specifications) as state transition diagrams having the parallel and hierarchy concept. By introducing the parallel and hierarchy concept in the description of state transition diagrams, large-scale specifications can be easily described.

Each of the state transition diagram searching units 2 searches state transition diagrams as directed graphs for test case generation. More specifically, each state transition diagram searching unit 2 reads state transition information from the product specification describing unit 1, and generates a test case while specifying the operations of the product as a series of paths of directed graphs in the state transition diagrams. During execution, one transition state diagram searching unit 2 is assigned to one state transition diagram. Each state transition diagram searching unit 2 always manages the current state of the corresponding state transition diagram, and executes searching by a method of transiting the current state to the next state by selecting transitions from the current state one by one with reference to an occurring/unoccurring event informed from the action/event relation management unit 5 (to be described in detail later). Each transition information selected by each state transition diagram searching unit 2 is sequentially transmitted to the test case storing unit 6 in the form of an event for causing the transition, and is stored as an event series.

The parallel relation managing unit 3 manages the relation of a plurality of state transition diagrams which are parallelly operated. More specifically, the parallel relation managing unit 3 manages the execution order of searching a plurality of parallel transition state diagrams. This is because the parallel state transition diagrams apparently have a parallel relation therebetween but are searched in a sequential order in practice.

The hierarchy relation managing unit 4 manages a plurality of state transition diagrams which are executed parallel to each other while holding a hierarchy relation thereamong as a result of hierarchy of the operation specifications. The first role of the hierarchy relation managing unit 4 is to manage the execution order of a plurality of hierarchical state transition diagrams. The second role of the hierarchy relation managing unit 4 is to monitor adequacy of transition coverage for transition selection of the state transition diagram searching units 2.

The action/event relation managing unit 5 manages the relations of actions and events. The relations of actions and events are normally used in communications between parallel state transition diagrams, and the action/event relation managing unit 5 manages a relation in which upon execution of a given action, a certain event is consequently generated (or ungenerated). The action/event relation managing unit 5 manages, for example, a relation such that when an action "set flag" is executed, an event "flag is in set state" occurs. In this manner, when the action/event relation managing unit 5 presents occurring/unoccurring event information to the searching units 2, a test case corresponding to an event, which never occurs in practice, can be avoided from being generated.

The test case storing unit 6 holds (stores) a test case which is being generated (or which has been generated) by the state transition diagram searching units 2. The storing unit 6 receives and stores transitions (event information for causing the transitions in practice) which are sequentially selected by and informed from the state transition diagram searching units 2. Upon completion of searching by the state transition diagram searching unit 2, a series of these transitions (event information) is stored as a test case in the test case storing unit 6.

The operation of the test case generating apparatus according to the third embodiment with the above arrangement will be described below.

The product specification describing unit 1 formally describes the operation specifications of a product. The product specifications are described in the form of state transition diagrams. In this case, the present invention introduces the parallel and hierarchy concept in normal state transition diagrams to provide describability of describing recent complicated, large-scale specifications. Since the parallel and hierarchy concept is used in the description of the operation specifications to allow structured definition of the operation specifications, the operation specifications can be easily described.

The state transition diagram searching units 2 respectively store a plurality of parallel and hierarchy state transition diagrams. Each state transition diagram searching unit 2 searches the corresponding state transition diagram using, e.g., a directed graph searching technique. More specifically, each state transition diagram searching unit 2 searches for a test case while specifying operations as a series of paths of directed graphs in the state transition diagram. When a plurality of state transition diagrams are operated simultaneously because a plurality of state transition diagrams are in a parallel and hierarchy relation, the state transition diagram searching units 2 execute searching in accordance with a searching order instruction of the corresponding state transition diagrams from the parallel relation managing unit 3 and hierarchy relation managing unit 4, thereby generating a test case for the product as a whole.

Upon searching of the state transition diagrams by the state transition diagram searching units 2, whether or not a given transition is to be selected cannot be sufficiently determined by a normal concept of coverage, i.e., a concept in that each transition need only be passed at least once, but may be determined in consideration of a combination of a plurality of states of state diagrams in a hierarchy relation. The hierarchy relation managing unit 4 supplies adequacy information indicating whether or not each transition is to be selected to each state transition diagram searching unit 2 in response to an inquiry from the searching unit 2 in consideration of a combination of states (of state transition diagrams) in a hierarchy relation. With this processing, the state transition diagrams can be searched without omissions of product operations.

Upon searching of the state transition diagrams by the state transition diagram searching units 2, if the state transition diagrams are merely searched as directed graphs, every transition are possible. However, each transition is associated with an event and an action. In addition, since an event means a condition of transition, and an action means processing upon transition, an event which does or does not occur in a given state can often be identified. Such a situation is often observed especially when a plurality of parallel state transition diagrams exchange information.

The action/event relation managing unit 5 manages the relations of actions and events, and identifies an event which can occur (or cannot occur) in a given state. When each state transition diagram searching unit 2 selects a transition during searching, it inquires the action/event relation managing unit 5 to check possibility of an event, and does not generate a test case corresponding to an impossible operation in practice.

Transitions (more precisely, events which cause the transitions) selected by the state transition diagram searching unit 2 are aligned in a sequence in the order of occurrence. Thus, test cases for the product specifications as a whole is constituted. Each state transition diagram searching unit 2 informs the selected transition (event) to the test case storing unit 6. The test case storing unit 6 time-serially manages informed transitions (events), and stores them as one test case upon completion of searching of all the state transition diagrams.

As described above, test cases without omissions, which can sufficiently assure the reliability of product operations in a system test can be generated.

FIG. 16 is a flow chart showing a method of generating actual test cases by realizing the above-mentioned operations.

A control unit (not shown) initializes a work data area used for a generation work of a test case (step S1). This storage area serves as an area for storing adequacy of the test-case in units of transitions, and an area for storing occurring/unoccurring events of the action/event relation managing unit. In this case, the adequacy of the test case means whether or not the test case covers all state transitions in the operation specifications described in the state transition diagrams. Therefore, when the adequacy of the test case is 100%, the test case covers all the state transitions in the operation specifications described in the state transition diagrams.

The state transition diagram searching units 2 read the product specifications described by the product specification describing unit 1 (step S2). The state transition diagram searching units 2 read the product specifications described by the product specification describing unit 1 (step S2). The information of the state transition diagram is stored in a table form shown in FIG. 4 in the first embodiment.

Searching (i.e., generation of test cases) is started from step S3. In step S3, it is checked if generation of one test case has ended. In this case, the end of generation of one test case is determined using the following conditions: when adequacies of all transitions become 100%; when adequacies of all transitions within a range accessible from the current state become 100%; when there is no transition destination from the current state of the state transition diagram; or when the test case exceeds a predetermined length; and the like.

The state transition diagrams to be searched are determined (step S4). The parallel relation managing unit 3 specifies searching processes of the state transition diagram searching unit 2. Note that the process represents a unit of state transition diagrams which can be parallelly executed. One process is constituted by one or more state transition diagrams and a plurality of state transition diagrams developed therefrom.

For example, FIG. 1 is constituted by two processes. One process consists of the state transition diagrams SD1, SD2, SD4, and SD5, and the other process consists of the state transition diagram SD3.

The process to be searched is determined by the same method as that in the first embodiment. When one process is constituted by a plurality of layers, the control shifts to the next process after searching is executed for all the layers.

After the process is determined, the hierarchy relation managing unit 4 determines a layer to be searched in the designated process. The method of determining the layer is the same as that in the second embodiment.

The state transition diagram searching units 2 execute searching of the designated state transition diagram, and select a transition (step S5). The method of searching transitions is the same as that in the second embodiment.

It is checked if a transition is selected as a result of execution of searching in step S5 (step S6). If a transition is selected, the flow advances to step S7, and the transition selected in step S5 is executed (step S7). If a transition is not selected in step S5, the flow advances to step S10. In step S7, execution of the transition is defined by execution of an action and a transition of a state.

Upon execution of an action, occurring events and unoccurring events are registered in the action/event relation managing unit 5 as in execution of an action in the first embodiment.

A transition to another state is the same as that in the second embodiment.

In the test case storing unit 6, events constituting test cases are registered (step S8). In this case, the state transition diagram searching unit 2 transits event information for causing the transition selected in step S5 to the test case storing unit 6. The test case storing unit 6 stores the transmitted event information as a history of searching, and upon completion of searching, the stored history of searching constitutes one test case.

In the test case storing unit 6, local adequacy information of a test case is registered (step S9). As a method of managing adequacy, the "adequacy-tree" is used as in the second embodiment to take combinations of states among layers into consideration. As for covered transitions, a "covered" attribute is assigned to paths from the root (the highest node of the tree) to leaves of the "adequacy-tree", thereby preventing omissions and repetitions in test cases.

If it is determined in step S6 that a transition is not selected, step S10 is executed. In step S10, the occurrence/non-occurrence of deadlock of searching is checked. The contents of the deadlock are the same as in the first embodiment. The searching order of the state transition diagrams in the hierarchy relation is managed by the parallel relation managing unit 3 and the hierarchy relation managing unit 4. If none of the state transition diagram searching units 2 select a transition even after a cycle of this searching is executed for the state transition diagrams, it is recognized that deadlock has occurred.

Processing branches depending on the occurrence/non-occurrence of deadlock in step S10 (step S11). If it is determined in step S11 that deadlock has not occurred, the flow advances to step S3; otherwise, the flow advances to step S12.

A transition which can avoid deadlock is searched for (step S12). In this case, one transition is selected from those from the current states of all the state transition diagram searching units 2. At this time, an unoccurring event is checked with reference to the action/event relation managing unit 5, and an untransitionable transition under the condition cannot be selected. If there are a plurality of selectable candidate transitions, one of these transitions is selected. As a selection method, in consideration of the hierarchy relation with reference of adequacy-tree, a method of preferentially selecting a transition of the state transition diagram searching unit 2 including many unselected transitions, a method of selecting a transition with the smallest number of times of selection, a method of determining a transition by a random number at an equal probability if the conditions are the same, and the like are available.

As a result of step S12, if it is determined that a transition which can avoid deadlock can be found (step S13), the transition is selected, and the flow advances to step S7 to continue test case generation. If it is determined that a transition which can avoid deadlock cannot be found in step S12 (step S13), the product specifications themselves may be wrong specifications which cause deadlock. Thus, the flow advances to step S14, and a message indicating that an error is found in the product specifications themselves is presented to a developer. Thereafter, test case generation ends (step S14).

As a result of step S3, if generation of one test case ends, the flow advances to step S15, and a test case is generated (step S15). Note that a series of event histories stored in the test case storing unit 6 becomes a test case to be given to a product. The test case can be output as a file in a format, as shown in, e.g., FIG. 9. In addition, data may be supplied to a system for generating test signals, and automatic testing may be realized.

It is checked if generation of the test case is completed (step S16). The completion is determined under the following conditions: when adequacies of all transitions become 100%; when the number of test cases exceeds a predetermined value; and the like. If it is determined that generation of the test case is completed, the processing ends, otherwise, the flow advances to step S17 to reinitialize the work data area to prepare for the next test case generation (step S17). More specifically, operations for restoring the current state of each state transition diagram searching unit 2 to an initial state, restoring the storage state of occurring/unoccurring events of the action/event relation managing unit 5 to an initial state, and so on, are performed. Information associated with adequacy of each transition is preserved in this case. After reinitialization, the flow returns to step S3.

An example of test case generation according to the present invention will be described below using some of hierarchical and parallel state transition diagrams shown in FIG. 1.

FIG. 17 shows hierarchical and parallel state transition diagrams.

Test case generation is performed according to the flow chart of the third embodiment.

In initialization (step S1), the action/event relation managing unit 5 reads the definitions of the relations of events and actions. In this example, upon execution of an action: heater ON, an event: heater=ON is generated and an event: heater=OFF is ungenerated; upon execution of an action: heater OFF, an event: heater=OFF is generated and an event: heater=ON is ungenerated. In an initial state, an event: heater=OFF is generated, and an event: heater=ON is ungenerated. The hierarchy relation managing unit 4 generates a "adequacy-tree", and initializes attributes of paths corresponding to different combinations of states. In this case, the state transition diagrams SD1 and SD2 have a hierarchy relation therebetween, and a adequacy-tree shown in FIG. 18 is generated. In FIG. 18, branches indicated by dotted lines represent that transitions are not covered by a test case.

The state transition diagram searching units 2 read the specification description of the state transition diagrams (step S2). In this example, since there are three state transition diagrams, three state transition diagram searching units 2 are assigned. In other words, the state transition diagram searching units 2 respectively used for the state transition diagrams SD1, SD2, and SD3 are prepared.

The state transition diagrams to be searched by the state transition diagram searching units 2 are designated (step S4). The searching order is determined in consideration of the hierarchy relation and the parallel relation. In this example, the state transition diagrams are searched in the order of state transition diagram SD2→state transition diagram SD1 state transition diagram SD3→state transition diagram SD2→ . . . . In this case, an inactive state transition diagram at that time is not subjected to searching, and the control advances to the next state transition diagram. Therefore, since the state transition diagram SD2 is not active at the beginning of searching, the state transition diagram SD1 is searched.

An occurring event is only "heater=OFF" (step S5), and a transition is not selected (step S6). In this diagram, since transition 1 is not checked, transition 1 is selected.

Since transition 1 is selected in step S58, the flow advances to step S7 (step S6).

Upon execution of a state transition, an event "heater=OFF" is generated and an event "heater=ON" is ungenerated by the initialization processing of the action (step S7). This information is managed by the action/event relation managing unit 5. Furthermore, in a transition of the state, the current state transits to "working" state. Furthermore, the state transition diagram SD2 in the lower layer is activated, and the current state of the state transition diagram SD2 is set to be an initial state "heating wait".

An event "start" of transition 1 is informed to and registered in the test case storing unit 6 (step S8).

As for transition 1, selected attributes of combinations corresponding to paths from the root to "stop" of the "adequacy-tree" are recorded (step S9).

In searching of the state transition diagram SD3 in step S5, since event "heater=ON" in transition 5 is impossible to occur, this transition is not selected, and the flow advances to step S10.

In the state transition diagram SD1, since transition 1 has been selected in the immediately preceding searching, no deadlock state of searching occurs, and the flow advances to step S3 (steps S10 and S11).

Furthermore, the state transition diagram SD2 is designated as the next diagram to be searched (step S4), and transition 3 is selected (step S5). As a result, the state of the state transition diagram SD2 transits to "heating". In this case, an event "heater=ON" occurs, and an event "heater=OFF" does not occur.

Subsequently, the state transition diagram SD1 is searched, and transition 2 is selected. At this time, the adequacy-tree is updated, as shown in FIG. 19.

In the operations so far, transitions 1, 2, and 3 are selected, and a test case is generated up to "start", "heating start temperature", "stop".

Upon continuation of the above-mentioned processing, the test cases can be generated.

The present invention is not limited to the above embodiments.

For example, in order to assure reliability at the system test level, a test apparatus for converting testing by hand operations into mechanical operations is known. When input signals are input as a series of signal values at a predetermined sampling period, the apparatus automatically supplies the input value to a product to be tested, and monitors inputs/outputs to compare the specifications given in advance by state transition diagrams with the history of inputs/outputs, thereby determining whether the product operates according to the specifications and automatically discriminating whether or not test results are OK. With this test apparatus, problems of inaccuracy of tests and the number of steps by hand operations can be solved. When the test case generating apparatus is applied to the above-mentioned test apparatus, a series of works from generation of a test case to operation tests can be automatically performed.

The test case storing unit 6 may be arranged as an external storage device in place of a portion of the test case generating apparatus. In this case, searching results are sequentially output from an output terminal.

Furthermore, in order to generate a test case, the apparatus may comprise a product specification describing unit 1 for generating parallel or hierarchical state transition diagrams, state transition diagram searching units 2, and an action/event relation managing unit 5. In this case, the parallel relation managing unit 3 and the hierarchy relation managing unit 4 in the first to third embodiments are omitted especially when the execution order need not be managed or when a computer capable of parallel executions is used.

In the first to third embodiments, the state transition diagram searching units 2 are prepared in correspondence with the number of state transition diagrams. However, the present invention is not limited to this. For example, a single state transition diagram searching unit 2 may search a plurality of state transition diagrams.

Various other modifications of the invention may be made without departing from the scope of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. Apparatus for generating test cases for use in testing a product, comprising:

a product specification describing unit which describes product specifications as a plurality of parallel state transition diagrams capable of being simultaneously executed;

a plurality of state transition diagram searching units each of which searches one of the plurality of parallel state transition diagrams in parallel with the other state transition searching units and generates as an output state transition information for the one state transition diagram searched;

a test case storing unit for storing state transition information output by the plurality of state transition searching units;

means for controlling an execution order of searching by the plurality of state transition diagram searching units; and an action/event relation managing unit, coupled to the plurality of state transition diagram searching units, which identifies those events which can occur and those events which cannot occur in a given state and, responsive thereto, prevents each of the plurality of state transition diagram searching units from generating test cases representing impossible events, wherein each state transition searching unit searches one of the respective parallel state transition diagrams by transitioning between a current state and a next state under control of the action/event relation managing unit.

2. An apparatus according to claim 1, further comprising:

concurrent relation managing means for controlling a transition selection operation of said state transition diagram searching units by managing a searching order of the plurality of parallel state transition diagrams described by said product specification describing unit.

3. An apparatus according to claim 1, wherein the test case storing unit stores event information for causing the transition output from said state transition diagram searching units as a part of one test case.

4. An apparatus according to claim 1, wherein said test case storing unit comprises means for time-serially managing events selected by said state transition diagram searching units.

5. An apparatus according to claim 1, wherein each of said state transition diagram searching units comprises means for checking an occurring event with reference to said action/event relation managing unit.

6. A test case generating apparatus for generating a test case used for verifying an operation of an object, comprising:

operation specification describing means for describing operation specifications of the object using a global state transition diagram which includes a plurality of hierarchical partial state transition diagrams, said plurality of hierarchical partial state transition diagrams including at least first and second partial state transition diagrams;

action/event relation managing means for managing a relation between said first and second state transition diagrams as relation information between an action and an event; and state transition diagram searching means for searching predetermined ones of said state transition diagrams based on the relation information managed by said action/event relation managing means, and for selecting a transition from a first state to a second state in said predetermined state transition diagrams, and outputting a selection result as transition information, wherein the action/event relation managing means identifies those events which can occur and those events which cannot occur in a given state and, responsive thereto, prevents the state transition diagram searching means from selecting transitions representing impossible events.

7. An apparatus according to claim 6, further comprising:

hierarchy relation managing means for controlling the transition selection of said state transition diagram searching means by managing a searching order of the plurality of hierarchical partial state transition diagrams described by said operation specification describing means and a rate of transition coverage.

8. An apparatus according to claim 7, further comprising:

test case storing means for storing event information for causing the transition output from said state transition diagram searching means as a part of one test case.

9. An apparatus according to claim 8, wherein said test case storing means comprises means for time-serially managing events selected by said state transition diagram searching means.

10. An apparatus according to claim 6, wherein said state transition diagram searching means comprises means for checking an occurring event with reference to said action/event relation managing means.

11. An apparatus according to claim 6, wherein said state transition diagram searching means comprises means for discriminating whether or not a selectable transition covers all state combinations among layers.

12. An apparatus according to claim 6, wherein said operation specification describing means comprises means for describing the operation specification using a plurality of concurrent partial state transition diagrams.

13. An apparatus according to claim 12, further comprising:

hierarchy relation managing means for controlling the transition selection of said state transition diagram searching means by managing a searching order of the plurality of hierarchical partial state transition diagrams described by said operation specification describing means and a rate of transition coverage; and concurrent relation managing means for controlling the transition selection of said state transition diagram searching means by managing a searching order of the plurality of concurrent partial state transition diagrams described by said operation specification describing means.

14. An apparatus according to claim 13, further comprising:

test case storing means for storing event information for causing the transition output from said state transition diagram searching means as a part of one test case.

15. An apparatus according to claim 12, wherein said state transition diagram searching means comprise means for discriminating whether or not a selectable transition covers all state combinations among layers.

16. A method of generating test cases used for verifying operations of an object, comprising the steps of:

describing operation specifications of the object using a plurality of partial state transition diagrams in at least one of concurrent and hierarchy formats;

searching the plurality of partial state transition diagrams to select a transition from a predetermined partial state to a next state, and outputting a selection result;

controlling a transition selection operation by identifying events which can occur and events which cannot occur in a given state and preventing the selection of transitions representing impossible events; and storing a relation between an action and an event.

17. A method according to claim 16, wherein the searching step comprises the step of checking an occurring event with reference to the relation between the action and the event.

18. A method according to claim 16, further comprising the step of:

controlling the transition selection operation by managing a searching order of the plurality of partial state transition diagrams.

19. A method according to claim 18, wherein the controlling step comprises the step of managing a rate of transition coverage.

20. A method according to claim 19, wherein the controlling step comprises the step of discriminating whether or not a selectable transition covers all state combinations among layers.

* * * * *